United States Patent
Hansen et al.

(10) Patent No.: US 8,576,377 B2
(45) Date of Patent: Nov. 5, 2013

(54) LITHOGRAPHIC APPARATUS AND DEVICE MANUFACTURING METHOD

(75) Inventors: Steven George Hansen, Phoenix, AZ (US); Heine Melle Mulder, Veldhoven (NL); Robert Kazinczi, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 1016 days.

(21) Appl. No.: 12/000,092

(22) Filed: Dec. 7, 2007

(65) Prior Publication Data

US 2008/0186468 A1     Aug. 7, 2008

Related U.S. Application Data

(63) Continuation-in-part of application No. 11/797,356, filed on May 2, 2007, now abandoned.

(60) Provisional application No. 60/877,350, filed on Dec. 28, 2006.

(51) Int. Cl.
*G03B 27/54* (2006.01)
*G03B 27/68* (2006.01)
*G03B 27/32* (2006.01)
*G03B 27/42* (2006.01)
*G03B 27/52* (2006.01)

(52) U.S. Cl.
USPC ............ 355/67; 355/52; 355/53; 355/55; 355/77

(58) Field of Classification Search
USPC .......... 355/52, 53, 55, 67–71, 77; 250/492.1, 250/492.2, 492.22, 493.1, 548; 430/5, 8, 430/22, 30, 311, 312, 321
See application file for complete search history.

(56) References Cited

U.S. PATENT DOCUMENTS

| | | | | |
|---|---|---|---|---|
| 5,424,803 A * | 6/1995 | Noguchi | | 355/53 |
| 5,867,253 A * | 2/1999 | Nakae | | 355/52 |
| 6,015,644 A * | 1/2000 | Cirelli et al. | | 430/30 |
| 6,078,380 A * | 6/2000 | Taniguchi et al. | | 355/52 |
| 6,115,108 A * | 9/2000 | Capodieci | | 355/77 |
| 6,346,979 B1 * | 2/2002 | Ausschnitt et al. | | 355/53 |

(Continued)

FOREIGN PATENT DOCUMENTS

| | | |
|---|---|---|
| JP | 05-175100 A | 7/1993 |
| JP | 07-037769 A | 2/1995 |

(Continued)

OTHER PUBLICATIONS

Office Action in related Japanese Application No. 2007-329420 mailed Nov. 26, 2010.

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

A method for configuring an illumination source of a lithographic apparatus is presented. The method includes dividing the illumination source into pixel groups, each pixel group including one or more illumination source points; selecting an illumination shape to expose a pattern, the illumination shape formed with at least one pixel group; iteratively calculating a lithographic metric as a result of a change of state of a pixel group in the illumination source, the change of the state of the pixel group creating a modified illumination shape; and adjusting the illumination shape based on the iterative results of calculations.

29 Claims, 20 Drawing Sheets

(56) References Cited

U.S. PATENT DOCUMENTS

| | | | |
|---|---|---|---|
| 6,388,736 B1* | 5/2002 | Smith et al. | 355/53 |
| 6,839,125 B2 | 1/2005 | Hansen | |
| 7,016,017 B2 | 3/2006 | Hansen | |
| 7,623,220 B2* | 11/2009 | Granik | 355/67 |
| 2002/0062206 A1* | 5/2002 | Liebchen | 703/6 |
| 2002/0152452 A1* | 10/2002 | Socha | 716/21 |
| 2002/0177054 A1* | 11/2002 | Saitoh et al. | 430/22 |
| 2002/0191165 A1* | 12/2002 | Baselmans et al. | 355/52 |
| 2004/0053148 A1* | 3/2004 | Morohoshi | 430/30 |
| 2004/0137343 A1* | 7/2004 | Eurlings et al. | 430/30 |
| 2004/0141167 A1* | 7/2004 | Sasaki | 355/67 |
| 2004/0156029 A1* | 8/2004 | Hansen | 355/67 |
| 2004/0246457 A1* | 12/2004 | Okazaki | 355/67 |
| 2004/0265707 A1* | 12/2004 | Socha | 430/5 |
| 2005/0024612 A1* | 2/2005 | Hirukawa et al. | 355/55 |
| 2005/0122501 A1* | 6/2005 | Rosenbluth | 355/69 |
| 2005/0168498 A1* | 8/2005 | Granik | 345/698 |
| 2005/0219502 A1* | 10/2005 | Sandstrom et al. | 355/77 |
| 2005/0231616 A1* | 10/2005 | Iwai et al. | 348/241 |
| 2006/0008716 A1* | 1/2006 | Jeunink et al. | 430/30 |
| 2006/0046168 A1* | 3/2006 | Fukuhara | 430/30 |
| 2006/0208205 A1* | 9/2006 | Chen et al. | 250/492.22 |
| 2011/0116067 A1* | 5/2011 | Ye et al. | 355/67 |

FOREIGN PATENT DOCUMENTS

| | | |
|---|---|---|
| JP | 08-335552 A | 12/1996 |
| JP | 11-195592 A | 7/1999 |
| JP | 2002-261004 A | 9/2002 |
| JP | 2002-324743 A | 11/2002 |
| JP | 2003-178966 A | 6/2003 |
| JP | 2004-111579 A | 4/2004 |
| JP | 2004-128108 A | 4/2004 |
| JP | 2004-191981 A | 7/2004 |
| JP | 2005-167253 A | 6/2005 |
| JP | 2005-228846 A | 8/2005 |
| JP | 2006-066440 A | 3/2006 |
| JP | 2007-520892 T | 7/2007 |

* cited by examiner

LITHOGRAPHIC APPARATUS AND DEVICE MANUFACTURING METHOD

CROSS-REFERENCE TO RELATED APPLICATIONS

This application is a Continuation-In-Part of U.S. patent application Ser. No. 11/797,356 filed on May 2, 2007, which claims the benefit of U.S. Provisional Patent Application No. 60/877,350, which was filed on Dec. 28, 2006. The contents of these applications are hereby incorporated in their entirety by reference.

FIELD

The present invention relates to a lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) of a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Photolithography is widely recognized as one of the key steps in the manufacture of ICs and other devices and/or structures. At present, no alternative technology seems to provide the desired pattern architecture with similar accuracy, speed, and economic productivity. However, as the dimensions of features made using photolithography become smaller, photolithography is becoming one of the most, if not the most, critical gating factors for enabling miniature IC or other devices and/or structures to be manufactured on a truly massive scale.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size of a feature arranged in an array with a 1:1 duty cycle (i.e., equal lines and spaces or holes with size equal to half the pitch). It follows from equation (1) that reduction of the minimum printable size of features can be obtained in three ways: by shortening the exposure wavelength $\lambda$, by increasing the numerical aperture $NA_{PS}$ or by decreasing the value of k1.

In order to improve resolution performance of a lithographic system, various tools may be used. In one approach, an illumination system of a lithographic apparatus is refined by considering alternatives to full circular illumination shapes. Such full circular illumination shapes are also referred to as conventional illumination. A radiation system of a lithographic apparatus generally includes an illumination system. The illumination system receives radiation from a source, such as a laser, and produces an illumination beam for illuminating an object, such as the patterning device (e.g. a mask on a mask table). Within a typical illumination system, the beam is shaped and controlled such that at a pupil plane of the illumination system the beam has a desired spatial intensity distribution. Such a spatial intensity distribution at the pupil plane effectively acts as a virtual radiation source for producing the illumination beam. Various shapes of the intensity distribution, consisting of (substantially uniform) light areas on a dark background, can be used. Any such shape will be referred to, hereinafter, as an illumination shape, an illumination mode, an illumination configuration, an illumination setting or a shape of an illumination source. A maximum selectable extent of aforementioned virtual radiation source is defined by the design of the illumination system (e.g., the optical extent of the illumination pupil), and corresponds to a maximum clear aperture size in the illumination pupil.

A system where illumination radiation is obliquely incident on the patterning device at an angle so that the zero-th and first diffraction orders are distributed on alternative sides of the optical axis may allow for improvements. Such an approach is generally referred to as off-axis illumination. Off-axis illumination improves resolution by illuminating the patterning device with radiation that is at an angle to the optical axis of the projection system. Examples of off-axis illumination include multipole illumination and annular illumination. The incidence of the radiation on the patterning device, which acts as a diffraction grating, improves the contrast of the image by transmitting more of the diffracted orders through the projection system. Off-axis illumination techniques used with conventional masks produce resolution enhancement effects similar to resolution enhancement effects obtained with phase shifting masks. Besides off-axis illumination, other currently available RET include optical proximity correction (OPC) of optical proximity errors (OPE), and sub-resolution assist features (SRAF). Each technique may be used alone, or in combination with other techniques to enhance the resolution of the lithographic projection tool.

As illumination systems have evolved from producing conventional to annular, and on to quadrupole and more complicated illumination configurations, the control parameters have concurrently become more numerous. In a conventional illumination mode, a circular area including the optical axis is illuminated in a pupil of the illumination system, the only adjustment to the illumination mode being to alter the outer radius ($\sigma_r$) of the circular illumination shape. Annular illumination requires the definition of an inner radius ($\sigma_c$) in order to define the illuminated ring of the annular illumination mode. For multipole patterns, the number of parameters which can be controlled continues to increase. For example, in a quadrupole illumination configuration, in addition to the two radii, a pole angle $\alpha$ defines the angle subtended by each pole between the selected inner and outer radii.

Concurrently, patterning device (e.g., mask) technology has been evolving as well. Binary intensity masks have given way to phase shift masks and other advanced designs. While a binary mask simply transmits, reflects or blocks imaging radiation at a given point, a phase shift mask may attenuate some radiation or it may transmit or reflect the light after imparting a phase shift, or both. Phase shift masks have been used in order to image features which are on the order of the imaging radiation's wavelength or smaller, since diffraction effects at these resolutions can cause poor contrast and end-of-line errors, among other problems.

Modern illumination systems have ever increasing numbers of variables which can be manipulated. In order to account for the various permutations of variable settings and to reduce the cost of trial and error optimization of illumination configurations, photolithographic simulations may be used to optimize the illumination conditions for a given mask pattern.

One approach for determining an optimal combination of the illumination shape and the patterning device pattern (e.g., the mask pattern) is to calculate the normalized aerial image log slope (NILS) at a number of pre-selected points, commonly referred to as fragmentation points, along the border of pattern features. Then, the intensity and shape of the illumination and the magnitude and phase of the diffraction orders from the patterning device pattern are simultaneously changed to form an image in the image plane that maximizes the minimum image log slope at the fragmentation points while forcing the intensity at the fragmentation points to be within a predetermined intensity range.

While maximizing NILS at selected sampling locations in the pattern enhances the budget/tolerance for exposure variation, commonly referred to as the exposure latitude EL, it may not help to increase the budget/tolerance for focus variations, commonly referred to as the depth of focus (DOF). Furthermore, results obtained with this approach generally may suffer at low k1, where pure image calculations deviate substantially from printed substrate results.

SUMMARY

It is desirable to optimize the illumination conditions of a lithographic apparatus to print features with greater precision.

In an embodiment of the invention, there is provided a method for configuring an illumination source of a lithographic apparatus, the method including dividing the illumination source into pixel groups, each pixel group including one or more illumination source points; selecting an illumination shape to expose a pattern, the illumination shape formed with at least one pixel group; iteratively calculating a lithographic metric as a result of a change of state of a pixel group in the illumination source, the change of the state of the pixel group creating a modified illumination shape; and adjusting the illumination shape based on the iterative results of calculations.

In an embodiment of the invention, there is provided a computer product having machine executable instructions, the instructions being executable by a machine to perform a method for configuring an illumination source of a lithographic apparatus, the method including dividing the illumination source into pixel groups, each pixel group including one or more illumination source points; selecting an illumination shape to expose a pattern, the illumination shape formed with at least one pixel group; iteratively calculating a lithographic metric as a result of a change of state of a pixel group in the illumination source, the change of the state of the pixel group creating a modified illumination shape; and adjusting the illumination shape based on the iterative results of calculations.

In an embodiment of the invention, there is provided a lithographic apparatus including an illumination system configured to condition a beam of radiation; a substrate table configured to hold a substrate; a projection system configured to project a beam of radiation patterned by a patterning device onto a surface of the substrate; and a processor to perform a method for configuring an illumination source of a lithographic apparatus, the method including dividing the illumination source into pixel groups, each pixel group including one or more illumination source points; selecting an illumination shape to expose a pattern, the illumination shape formed with at least one pixel group; iteratively calculating a lithographic metric as a result of a change of state of a pixel group in the illumination source, the change of the state of the pixel group creating a modified illumination shape; and adjusting the illumination shape based on the iterative results of calculations In an embodiment, there is provided a method for configuring an illumination source of a lithographic apparatus. The method includes dividing the illumination source into pixel groups, each pixel group including one or more illumination source points; selecting an illumination shape to expose a pattern, the illumination shape formed with at least one pixel group; changing a state of a pixel group in the illumination source to create a modified illumination shape; calculating a variation of an attribute of an image of the pattern as a result of the change of state of the pixel group; and adjusting the initial illumination shape based on the results of the calculating.

In another embodiment of the invention, there is provided a method for configuring an illumination source of a lithographic apparatus, the method including dividing the illumination source into pixel groups, each pixel group including one or more illumination source points; selecting an illumination shape to expose a pattern; calculating a plurality of responses for a plurality of changes in the illumination shape, each of the plurality of changes effected by a change of state of a pixel group; and adjusting the illumination shape based on the plurality of responses.

In yet another embodiment of the invention, there is provided a computer product having machine executable instructions, the instructions being executable by a machine to perform a method for configuring an illumination source of a lithographic apparatus, the method including dividing the illumination source into pixel groups, each pixel group including one or more illumination source points; selecting an illumination shape to expose a pattern, the illumination shape formed with at least one pixel group; changing a state of a pixel group in the illumination source to create a modified illumination shape; calculating a variation of an attribute of an image of the pattern as a result of the change of state of the pixel group; and adjusting the initial illumination shape based on the results of the calculating.

In an embodiment of the invention, there is provided a lithographic apparatus including an illumination system configured to condition a beam of radiation; a substrate table configured to hold a substrate; a projection system configured to project a beam of radiation patterned by a patterning device onto a surface of the substrate; and a processor to perform a method for configuring an illumination source of a lithographic apparatus, the method including dividing the illumination source into pixel groups, each pixel group including one or more illumination source points; selecting an illumination shape to expose a pattern, the illumination shape formed with at least one pixel group; changing a state of a pixel group in the illumination source to create a modified illumination shape; calculating a variation of an attribute of an image of the pattern as a result of the change of state of the pixel group; and adjusting the initial illumination shape based on the results of the calculating.

In an embodiment, there is provided a lithographic apparatus including an illumination system configured to condition a beam of radiation; a substrate table configured to hold a substrate; a projection system configured to project a beam of radiation patterned by a patterning device onto a surface of the substrate; and a processor configured to control an illumination source in a pupil plane of the illumination system, the processor configured to divide the illumination source into pixel groups, each pixel group including one or more illumination source points; select an illumination shape to expose a pattern, the illumination shape formed with at least one pixel group; iteratively calculate a lithographic metric as a result of a change of state of a pixel group in the illumination source, the change of the state of the pixel group creating a modified illumination shape; and adjusting the illumination shape based on the iterative results of calculations.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7b shows an initial illumination source that may be used to print the pattern of FIG. 7a;

DETAILED DESCRIPTION

Figure 1:
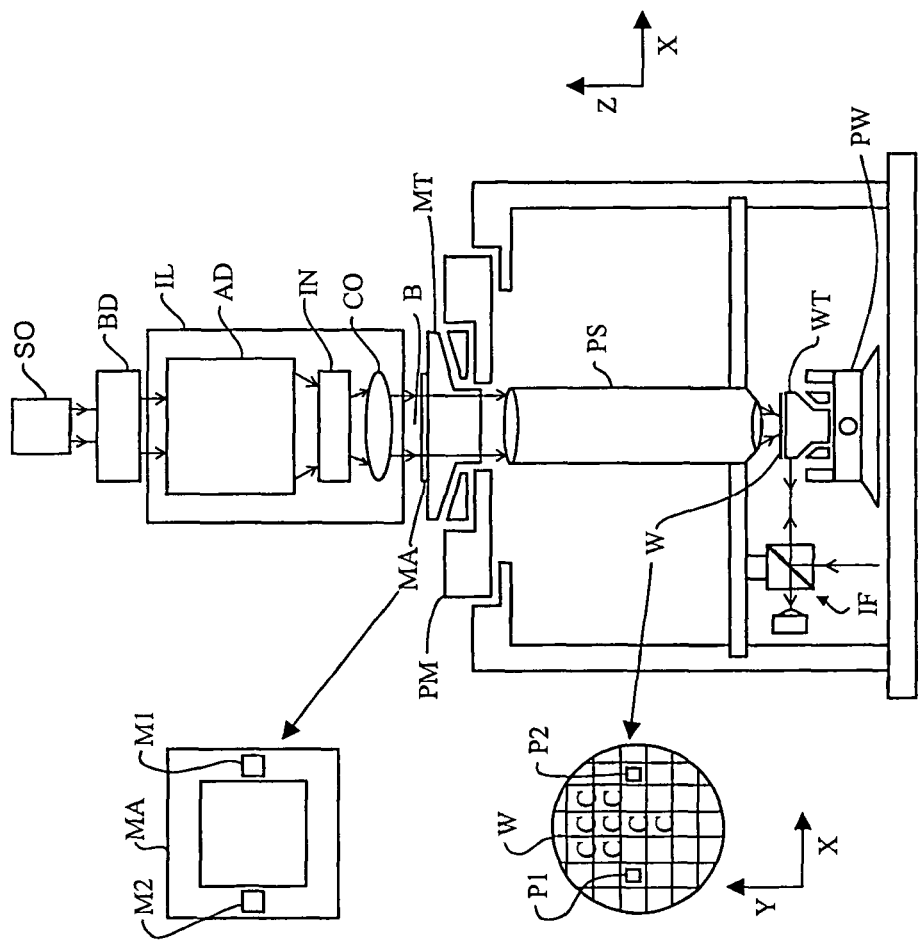
FIG. 1 schematically depicts a lithographic apparatus in accordance with an embodiment of the invention.

FIG. 1 schematically depicts a lithographic apparatus according to an embodiment of the invention. The apparatus includes an illumination system (illuminator) IL adapted to condition a beam B of radiation (e.g., UV radiation) and a support structure (e.g., a mask table) MT configured to hold a patterning device (e.g., a mask) MA and connected to a first positioning device PM configured to accurately position the patterning device with respect to the projection system PS. The apparatus also includes a substrate table (e.g., a wafer table) WT configured to hold a substrate (e.g., a resist-coated wafer) W and connected to a second positioning device PW configured to accurately position the substrate with respect to the projection system PS. The apparatus also includes a projection system (e.g., a refractive projection lens) PS adapted to image a pattern imparted to the beam B by the patterning device MA onto a target portion C (e.g., including one or more dies) of the substrate W.

As depicted here, the apparatus is of a transmissive type (e.g., employing a transmissive mask). Alternatively, the apparatus may be of a reflective type (e.g., employing a programmable mirror array of a type as referred to below).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD, including, for example, suitable directing mirrors and/or a beam expander. In other cases, the source may be an integral part of the apparatus, for example when the source is a mercury lamp. The source SO and the illuminator IL, together with the beam delivery system BD if required, may be referred to as a radiation system.

The projection system PS may include a diaphragm with an adjustable clear aperture used to set the numerical aperture of the projection system PS at substrate level to a selected value. The selectable numerical aperture, or, in the case of a fixed clear aperture, the fixed numerical aperture, will be referred to as $NA_{PS}$. At patterning device (e.g., mask) level, a corresponding angular capture range within which the projection system PS is capable of receiving rays of the beam of radiation is given by the object-side numerical aperture of the projection system PS, referred to as $NA_{PSOB}$. The object-side numerical aperture of the projection system PS is denoted by $NA_{PSOB}$. Projection systems in optical lithography are commonly embodied as reduction projection systems with a reduction ratio M of, for example, 5× or 4×. A numerical aperture $NA_{PSOB}$ is related to $NA_{PS}$ through the reduction ratio M by $NA_{PSOB}=NA_{PS}/M$.

The beam of radiation B provided by the illumination system IL to the patterning device MA includes a plurality of radiation rays that impinge onto the patterning device MA with a plurality of angles of incidence. These angles of incidence are defined with respect to the Z axis in FIG. 1. These rays can therefore be characterized by an illumination numerical aperture $NA_{IL}$, which is defined by $NA_{IL}=\sin$ (angle of incidence), where the index of refraction of the space upstream of the mask is assumed to be 1. However, instead of characterizing the illumination radiation rays by the numerical aperture $NA_{IL}$, the rays may alternatively be characterized by the radial positions of the corresponding points traversed by these rays in a pupil of the illumination system. The radial position is linearly related to $NA_{IL}$, and it is common practice to define a corresponding normalized radial position σ in a pupil of the illumination system by $\sigma = NA_{IL}/NA_{PSOB}$.

In addition to an integrator IN and a condensor CO, the illumination system typically includes an adjusting device AM configured to set an outer and/or inner radial extent (commonly referred to as σ-outer and σ-inner, respectively) of the intensity distribution in the pupil of the illumination system. In view of the normalization, when σ-outer=1, radiation rays traversing the edge of the illumination pupil can be captured (in the absence of diffraction by the patterning device (e.g., mask) MA) by the projection system PS, because then $NA_{IL}=NA_{PSOB}$.

The beam of radiation B is incident on the patterning device MA, which is held on the support structure MT. Having traversed the patterning device MA, the beam of radiation B passes through the projection system PS, which focuses the beam onto a target portion C of the substrate W. With the aid of the second positioning device PW and position sensor IF (e.g., an interferometric device), the substrate table WT can be moved accurately, e.g., so as to position different target portions C in the path of the beam B. Similarly, the first positioning device PM and another position sensor (which is not explicitly depicted in FIG. 2) can be used to accurately position the patterning device MA with respect to the path of the beam B, e.g., after mechanical retrieval from a mask library, or during a scan. In general, movement of the support structure MT and substrate table WT will be realized with the aid of a long-stroke module (coarse positioning) and a short-stroke module (fine positioning), which form part of one or both of the positioning devices PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus may be used in the following preferred modes:

1. In step mode, the support structure MT and the substrate table WT are kept essentially stationary, while an entire pattern imparted to the beam of radiation is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam of radiation is projected onto a target portion C (i.e., a single dynamic exposure). The velocity and direction of the substrate table WT relative to the support structure MT is determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations of the above described modes of use or entirely different modes of use may also be employed.

Figure 2:
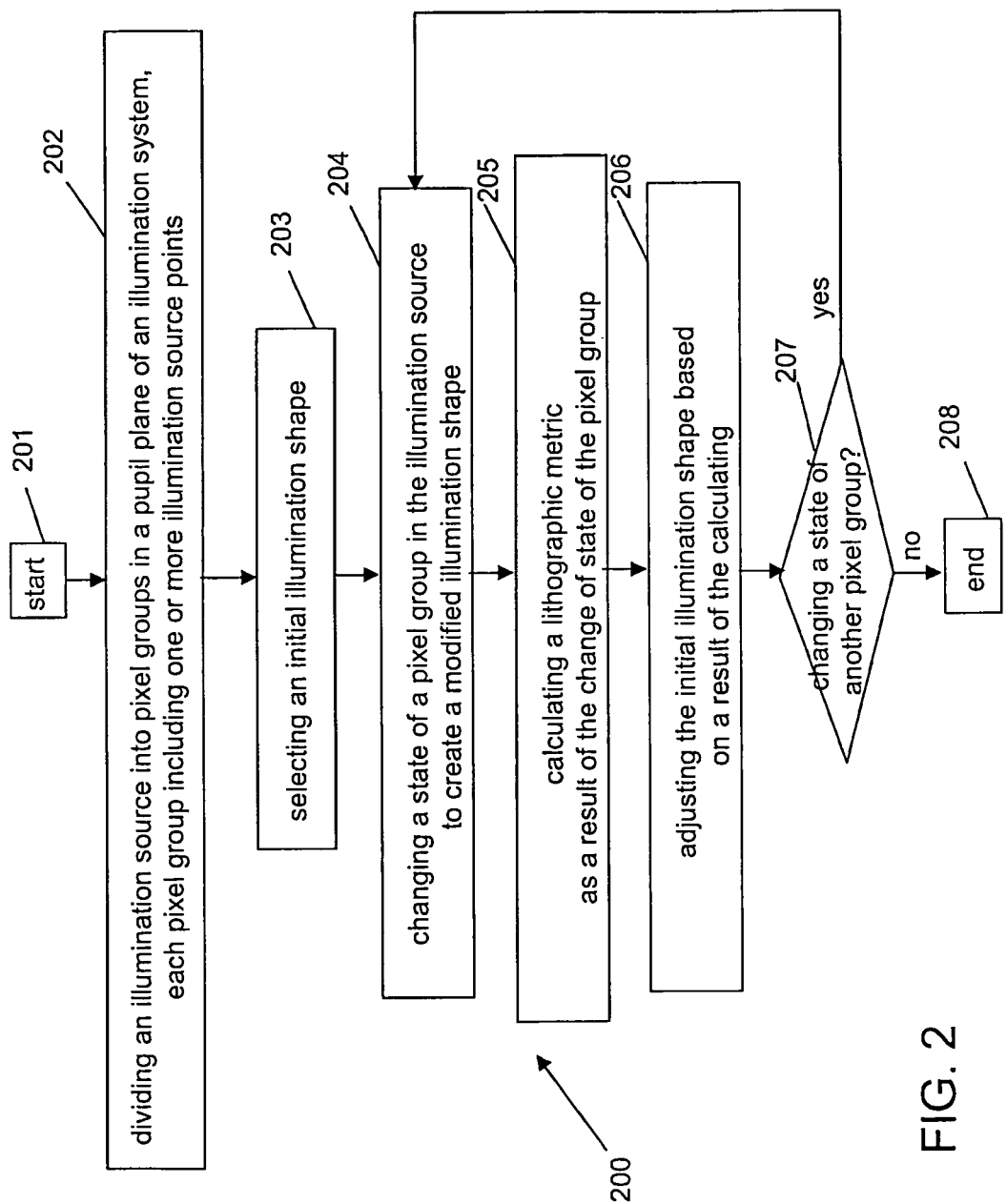
FIG. 2 shows an exemplary flowchart for configuring the illumination source in accordance with an embodiment of the invention.

In accordance with at least one embodiment of the invention, it is proposed to configure and optimize an illumination source and the shape of the source in view of an intended use of a selected patterning-device pattern for lithographically printing an IC pattern. For example, FIG. 2 shows a method for configuring the illumination source of a lithographic apparatus in accordance with an embodiment of the invention.

The method starts at block 201 and proceeds to block 202 where the illumination source of the illumination system IL is divided into a plurality of pixel groups or segments. Each pixel group or segment of the illumination source includes one or more illumination source points.

Figure 3:
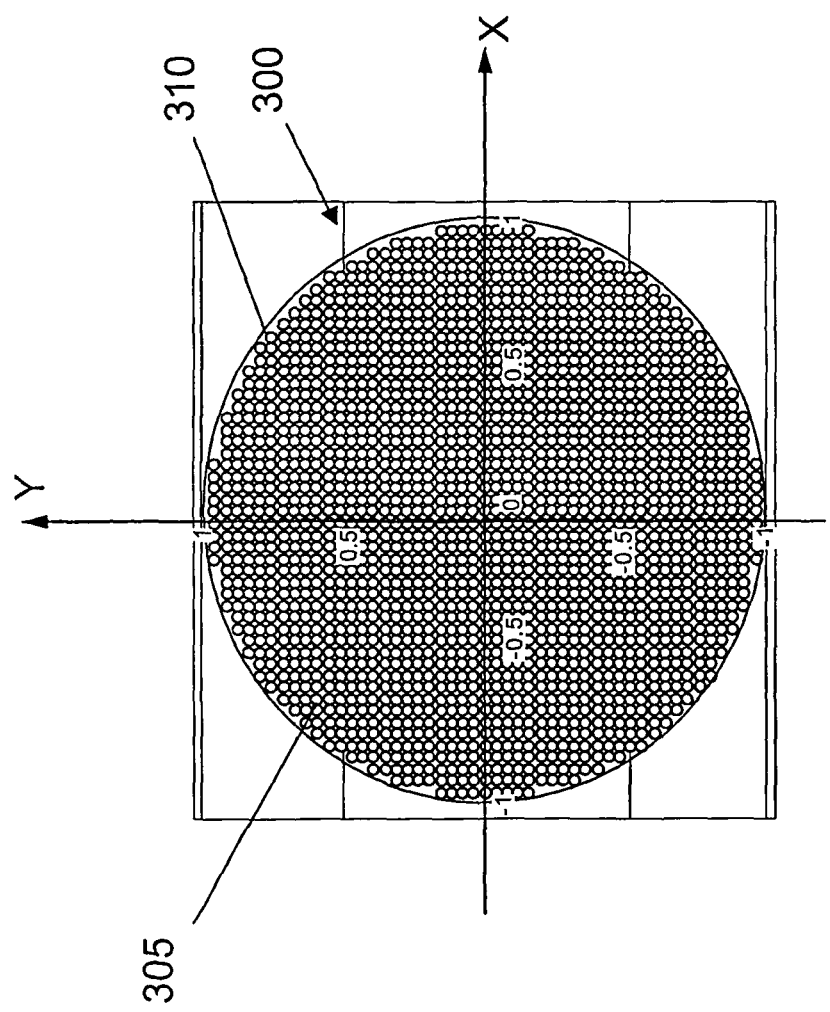
FIG. 3 is a schematic representation of a grid of illumination source points that may be used to model the illumination beam in the pupil plane of the illumination system.

FIG. 3 shows a schematic representation of a grid 300 of illumination source points 305 that may be used to model the illumination radiation beam B in the pupil plane of the illumination system IL. The grid 300 is centered on the optical axis of the lithographic apparatus. In FIG. 3, this optical axis is parallel to the Z axis. Decomposition of the illumination source into a plurality of individual source points is used in Abbe imaging to calculate the image of a pattern onto the substrate. Under Abbe's formulation, the intensity on the substrate of an image of the patterning device (e.g., mask) is calculated by dividing the illumination source into a number of individual source points. Each individual illumination source point that is part of the illumination beam illuminates the patterning device. The total intensity on the substrate is calculated by summing the intensity resulting from each individual source point.

The illumination source points 305 form a grid that spatially covers the entire cross-section of a clear aperture 310 in the pupil plane of the illumination system IL. The clear aperture 310 in the pupil plane of the illumination system IL has a normalized radius value of $\sigma_r=1$. The source points 305 located inside the numerical aperture will have their zero$^{th}$ diffraction order captured by the projection system PS. This situation corresponds to $\sigma_r \leq 1$. The physical location of each source point 305 relative to the full illuminator aperture may be varied depending on the degree of accuracy desired. For example, the grid spacing may be approximately 0.01. In the embodiment represented in FIG. 3, the grid 300 is constructed with a 51*51 square source point grid. Thus, in this implementation, the normalized diameter of the grid 300 includes 51 illumination source points. It will be appreciated that the number of illumination source points may vary in other embodiments of the illumination.

In accordance with block 202 of FIG. 2, grid 300 is divided into a plurality of pixel groups or segments that include one or more illumination source points 305. Each pixel group is defined by its polar coordinates ($\theta^r$, $\theta$). For each pixel group, radius $\sigma^r$ defines the distance from the center of the grid 300, which corresponds to the optical axis of the lithographic system, to the center of the pixel group. Angle $\theta$ corresponds to the angular position of the pixel group relative to the X axis. In FIG. 3, the X axis is substantially parallel to one of the main directions of the patterns that are being imaged. For example, the X axis may be parallel to the vertical or horizontal direction of the patterns. It will be appreciated that the orientation of the X axis may be different in other embodiments of the invention.

The total number of pixel groups that are considered (see block 205) may vary depending on the geometry of the pattern(s) that is or are being considered in the configuration or illumination process. In one implementation of the method of FIG. 2, two different symmetry classes may be considered to define the total number of pixel groups. For example, for simple pattern(s) with C4 symmetry, fewer pixel groups may be needed to perform the illumination configuration or optimization because the groups also have C4 symmetry and more pixels in each group than groups with lower symmetry. An example of such a pattern includes a pattern of horizontal and vertical lines or a square array of holes. These patterns are not changed by a 90° rotation. Therefore, the illuminator or illumination system will be symmetric about the X and Y axes and the diagonals. In this configuration, a pixel group in one octant can be symmetrically reproduced in the other octants during the configuration of the illumination conditions. Alternatively, for pattern(s) with lower symmetry, it may be desirable to use additional pixel groups to perform the illumination configuration, as each group also should have lower symmetry. An example of a pattern including two planes of symmetry is a pattern of vertical line, horizontal line or brickwall. A single V-line, brickwall, rectangular hole grid and chevron pattern have lower symmetry and a pixel group in one octant can be reflected in the X and Y axes but not the diagonals.

Figure 4:
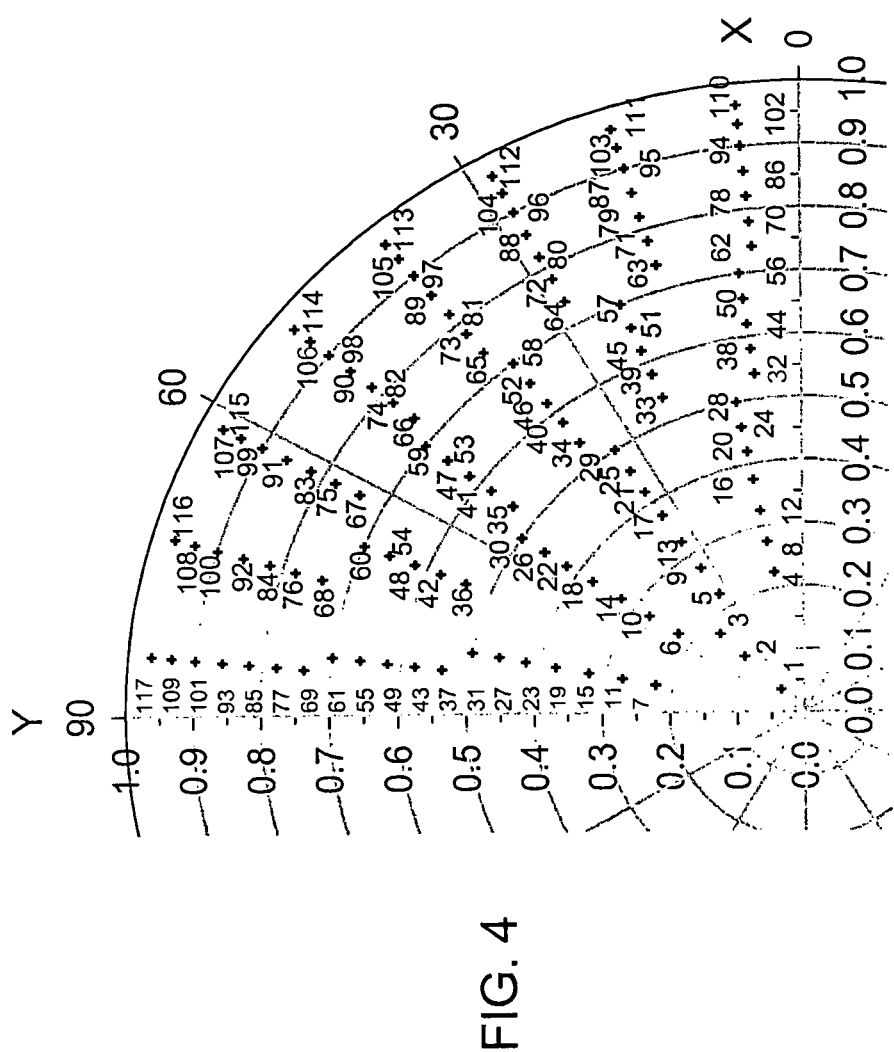
FIG. 4 shows the spatial position of each pixel group in a quadrant of the grid shown in FIG. 3.

Referring to FIG. 4, this figure shows the spatial position of each pixel group in the upper right quadrant of grid 300 in accordance with at least one embodiment of the invention. This quadrant includes 117 pixel groups. The positions of the pixel groups in the remaining quadrants of the grid 300 can be obtained by symmetry with respect to the X and Y axes. The map assignment for the pixel groups of FIG. 4 corresponds to a two-symmetry plane configuration. In this configuration, each pixel group is symmetrically mapped with respect to the X and Y axes. For reference, the coordinate position of each pixel group is shown in Table 1. As each pixel group may include more than one illumination source point, the radial and angular position ($\sigma_r$, $\theta$) of each pixel group includes a maximum and a minimum value.

TABLE 1

| Pixel Group | $\sigma_r$ min | $\sigma_r$ max | $\theta$ min | $\theta$ max |
|---|---|---|---|---|
| 1 | 0 | 0.1 | 0 | 90 |
| 2 | 0.1 | 0.15 | 0 | 90 |
| 3 | 0.15 | 0.2 | 0 | 90 |
| 4 | 0.2 | 0.25 | 0 | 22.5 |
| 5 | 0.2 | 0.25 | 22.5 | 45 |
| 6 | 0.2 | 0.25 | 45 | 67.5 |
| 7 | 0.2 | 0.25 | 67.5 | 90 |
| 8 | 0.25 | 0.3 | 0 | 22.5 |
| 9 | 0.25 | 0.3 | 22.5 | 45 |
| 10 | 0.25 | 0.3 | 45 | 67.5 |
| 11 | 0.25 | 0.3 | 67.5 | 90 |
| 12 | 0.3 | 0.35 | 0 | 22.5 |
| 13 | 0.3 | 0.35 | 22.5 | 45 |
| 14 | 0.3 | 0.35 | 45 | 67.5 |
| 15 | 0.3 | 0.35 | 67.5 | 90 |
| 16 | 0.35 | 0.4 | 0 | 22.5 |
| 17 | 0.35 | 0.4 | 22.5 | 45 |
| 18 | 0.35 | 0.4 | 45 | 67.5 |
| 19 | 0.35 | 0.4 | 67.5 | 90 |
| 20 | 0.4 | 0.44 | 0 | 22.5 |
| 21 | 0.4 | 0.44 | 22.5 | 45 |
| 22 | 0.4 | 0.44 | 45 | 67.5 |
| 23 | 0.4 | 0.44 | 67.5 | 90 |
| 24 | 0.44 | 0.48 | 0 | 22.5 |
| 25 | 0.44 | 0.48 | 22.5 | 45 |
| 26 | 0.44 | 0.48 | 45 | 67.5 |
| 27 | 0.44 | 0.48 | 67.5 | 90 |
| 28 | 0.48 | 0.52 | 0 | 22.5 |
| 29 | 0.48 | 0.52 | 22.5 | 45 |
| 30 | 0.48 | 0.52 | 45 | 67.5 |
| 31 | 0.48 | 0.52 | 67.5 | 90 |
| 32 | 0.52 | 0.56 | 0 | 15 |
| 33 | 0.52 | 0.56 | 15 | 30 |
| 34 | 0.52 | 0.56 | 30 | 45 |
| 35 | 0.52 | 0.56 | 45 | 60 |
| 36 | 0.52 | 0.56 | 60 | 75 |
| 37 | 0.52 | 0.56 | 75 | 90 |
| 38 | 0.56 | 0.6 | 0 | 15 |
| 39 | 0.56 | 0.6 | 15 | 30 |
| 40 | 0.56 | 0.6 | 30 | 45 |
| 41 | 0.56 | 0.6 | 45 | 60 |
| 42 | 0.56 | 0.6 | 60 | 75 |
| 43 | 0.56 | 0.6 | 75 | 90 |
| 44 | 0.6 | 0.64 | 0 | 15 |
| 45 | 0.6 | 0.64 | 15 | 30 |
| 46 | 0.6 | 0.64 | 30 | 45 |
| 47 | 0.6 | 0.64 | 45 | 60 |
| 48 | 0.6 | 0.64 | 60 | 75 |
| 49 | 0.6 | 0.64 | 75 | 90 |
| 50 | 0.64 | 0.68 | 0 | 15 |
| 51 | 0.64 | 0.68 | 15 | 30 |
| 52 | 0.64 | 0.68 | 30 | 45 |
| 53 | 0.64 | 0.68 | 45 | 60 |
| 54 | 0.64 | 0.68 | 60 | 75 |
| 55 | 0.64 | 0.68 | 75 | 90 |
| 56 | 0.68 | 0.72 | 0 | 15 |
| 57 | 0.68 | 0.72 | 15 | 30 |
| 58 | 0.68 | 0.72 | 30 | 45 |
| 59 | 0.68 | 0.72 | 45 | 60 |
| 60 | 0.68 | 0.72 | 60 | 75 |
| 61 | 0.68 | 0.72 | 75 | 90 |
| 62 | 0.72 | 0.76 | 0 | 11.25 |
| 63 | 0.72 | 0.76 | 11.25 | 22.5 |
| 64 | 0.72 | 0.76 | 22.5 | 33.75 |
| 65 | 0.72 | 0.76 | 33.75 | 45 |
| 66 | 0.72 | 0.76 | 45 | 56.25 |
| 67 | 0.72 | 0.76 | 56.25 | 67.5 |
| 68 | 0.72 | 0.76 | 67.5 | 78.75 |

TABLE 1-continued

| Pixel Group | $\sigma_r$ min | $\sigma_r$ max | $\theta$ min | $\theta$ max |
|---|---|---|---|---|
| 69 | 0.72 | 0.76 | 78.75 | 90 |
| 70 | 0.76 | 0.8 | 0 | 11.25 |
| 71 | 0.76 | 0.8 | 11.25 | 22.5 |
| 72 | 0.76 | 0.8 | 22.5 | 33.75 |
| 73 | 0.76 | 0.8 | 33.75 | 45 |
| 74 | 0.76 | 0.8 | 45 | 56.25 |
| 75 | 0.76 | 0.8 | 56.25 | 67.5 |
| 76 | 0.76 | 0.8 | 67.5 | 78.75 |
| 77 | 0.76 | 0.8 | 78.75 | 90 |
| 78 | 0.8 | 0.84 | 0 | 11.25 |
| 79 | 0.8 | 0.84 | 11.25 | 22.5 |
| 80 | 0.8 | 0.84 | 22.5 | 33.75 |
| 81 | 0.8 | 0.84 | 33.75 | 45 |
| 82 | 0.8 | 0.84 | 45 | 56.25 |
| 83 | 0.8 | 0.84 | 56.25 | 67.5 |
| 84 | 0.8 | 0.84 | 67.5 | 78.75 |
| 85 | 0.8 | 0.84 | 78.75 | 90 |
| 86 | 0.84 | 0.88 | 0 | 11.25 |
| 87 | 0.84 | 0.88 | 11.25 | 22.5 |
| 88 | 0.84 | 0.88 | 22.5 | 33.75 |
| 89 | 0.84 | 0.88 | 33.75 | 45 |
| 90 | 0.84 | 0.88 | 45 | 56.25 |
| 91 | 0.84 | 0.88 | 56.25 | 67.5 |
| 92 | 0.84 | 0.88 | 67.5 | 78.75 |
| 93 | 0.84 | 0.88 | 78.75 | 90 |
| 94 | 0.88 | 0.92 | 0 | 11.25 |
| 95 | 0.88 | 0.92 | 11.25 | 22.5 |
| 96 | 0.88 | 0.92 | 22.5 | 33.75 |
| 97 | 0.88 | 0.92 | 33.75 | 45 |
| 98 | 0.88 | 0.92 | 45 | 56.25 |
| 99 | 0.88 | 0.92 | 56.25 | 67.5 |
| 100 | 0.88 | 0.92 | 67.5 | 78.75 |
| 101 | 0.88 | 0.92 | 78.75 | 90 |
| 102 | 0.92 | 0.95 | 0 | 11.25 |
| 103 | 0.92 | 0.95 | 11.25 | 22.5 |
| 104 | 0.92 | 0.95 | 22.5 | 33.75 |
| 105 | 0.92 | 0.95 | 33.75 | 45 |
| 106 | 0.92 | 0.95 | 45 | 56.25 |
| 107 | 0.92 | 0.95 | 56.25 | 67.5 |
| 108 | 0.92 | 0.95 | 67.5 | 78.75 |
| 109 | 0.92 | 0.95 | 78.75 | 90 |
| 110 | 0.95 | 0.98 | 0 | 11.25 |
| 111 | 0.95 | 0.98 | 11.25 | 22.5 |
| 112 | 0.95 | 0.98 | 22.5 | 33.75 |
| 113 | 0.95 | 0.98 | 33.75 | 45 |
| 114 | 0.95 | 0.98 | 45 | 56.25 |
| 115 | 0.95 | 0.98 | 56.25 | 67.5 |
| 116 | 0.95 | 0.98 | 67.5 | 78.75 |
| 117 | 0.95 | 0.98 | 78.75 | 90 |

Table 2 shows the spatial position of a set of pixel groups corresponding to a four-symmetry plane configuration. In this configuration, each pixel group is symmetrically mapped with respect to the X and Y axes and the diagonal of the quadrant.

TABLE 2

| Pixel Group | $\sigma_r$ min | $\sigma_r$ max | $\theta$ min | $\theta$ max |
|---|---|---|---|---|
| 1 | 0 | 0.1 | 0 | 90 |
| 2 | 0.1 | 0.15 | 0 | 90 |
| 3 | 0.15 | 0.2 | 0 | 90 |
| 4 | 0.2 | 0.25 | 0 | 22.5 |
| 5 | 0.2 | 0.25 | 22.5 | 45 |
| 6 | 0.25 | 0.3 | 0 | 22.5 |
| 7 | 0.25 | 0.3 | 22.5 | 45 |
| 8 | 0.3 | 0.35 | 0 | 22.5 |
| 9 | 0.3 | 0.35 | 22.5 | 45 |
| 10 | 0.35 | 0.4 | 0 | 22.5 |
| 11 | 0.35 | 0.4 | 22.5 | 45 |
| 12 | 0.4 | 0.44 | 0 | 22.5 |
| 13 | 0.4 | 0.44 | 22.5 | 45 |
| 14 | 0.44 | 0.48 | 0 | 22.5 |
| 15 | 0.44 | 0.48 | 22.5 | 45 |
| 16 | 0.48 | 0.52 | 0 | 22.5 |
| 17 | 0.48 | 0.52 | 22.5 | 45 |
| 18 | 0.52 | 0.56 | 0 | 15 |
| 19 | 0.52 | 0.56 | 15 | 30 |
| 20 | 0.52 | 0.56 | 30 | 45 |
| 21 | 0.56 | 0.6 | 0 | 15 |
| 22 | 0.56 | 0.6 | 15 | 30 |
| 23 | 0.56 | 0.6 | 30 | 45 |
| 24 | 0.6 | 0.64 | 0 | 15 |
| 25 | 0.6 | 0.64 | 15 | 30 |
| 26 | 0.6 | 0.64 | 30 | 45 |
| 27 | 0.64 | 0.68 | 0 | 15 |
| 28 | 0.64 | 0.68 | 15 | 30 |
| 29 | 0.64 | 0.68 | 30 | 45 |
| 30 | 0.68 | 0.72 | 0 | 15 |
| 31 | 0.68 | 0.72 | 15 | 30 |
| 32 | 0.68 | 0.72 | 30 | 45 |
| 33 | 0.72 | 0.76 | 0 | 11.25 |
| 34 | 0.72 | 0.76 | 11.25 | 22.5 |
| 35 | 0.72 | 0.76 | 22.5 | 33.75 |
| 36 | 0.72 | 0.76 | 33.75 | 45 |
| 37 | 0.76 | 0.8 | 0 | 11.25 |
| 38 | 0.76 | 0.8 | 11.25 | 22.5 |
| 39 | 0.76 | 0.8 | 22.5 | 33.75 |
| 40 | 0.76 | 0.8 | 33.75 | 45 |
| 41 | 0.8 | 0.84 | 0 | 11.25 |
| 42 | 0.8 | 0.84 | 11.25 | 22.5 |
| 43 | 0.8 | 0.84 | 22.5 | 33.75 |
| 44 | 0.8 | 0.84 | 33.75 | 45 |
| 45 | 0.84 | 0.88 | 0 | 11.25 |
| 46 | 0.84 | 0.88 | 11.25 | 22.5 |
| 47 | 0.84 | 0.88 | 22.5 | 33.75 |
| 48 | 0.84 | 0.88 | 33.75 | 45 |
| 49 | 0.88 | 0.92 | 0 | 11.25 |
| 50 | 0.88 | 0.92 | 11.25 | 22.5 |
| 51 | 0.88 | 0.92 | 22.5 | 33.75 |
| 52 | 0.88 | 0.92 | 33.75 | 45 |
| 53 | 0.92 | 0.95 | 0 | 11.25 |
| 54 | 0.92 | 0.95 | 11.25 | 22.5 |
| 55 | 0.92 | 0.95 | 22.5 | 33.75 |
| 56 | 0.92 | 0.95 | 33.75 | 45 |
| 57 | 0.95 | 0.98 | 0 | 11.25 |
| 58 | 0.95 | 0.98 | 11.25 | 22.5 |
| 59 | 0.95 | 0.98 | 22.5 | 33.75 |
| 60 | 0.95 | 0.98 | 33.75 | 45 |

Figures 5A, 5B:
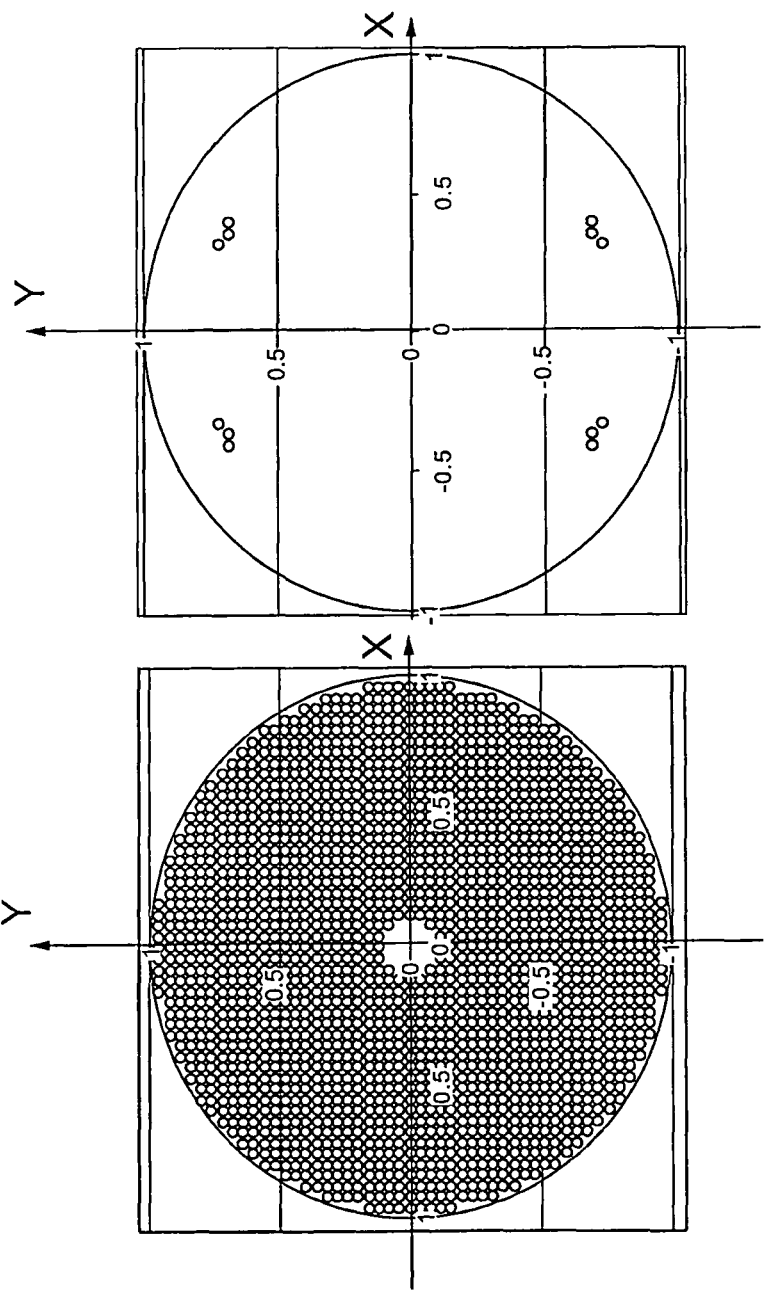
FIG. 5a shows the spatial position of a pixel group in the grid shown in FIG. 3.
FIG. 5b shows the spatial position of a pixel group different from the one shown in FIG. 5a, in the grid shown in FIG. 3.

FIGS. 5a-b show respectively the positions in grid 300 of the first and the seventy-fifth pixel groups of Table 1. FIG. 5a shows grid 300 without the first pixel group. As can be seen in FIG. 5a, the first pixel group includes the source points 305 that have a normalized radius $\sigma_r$ in the 0-0.1 range and an angular position in the 0-90° range (with respect to the quadrant shown in FIG. 4). As can be seen in FIG. 5b, the seventy-fifth pixel group includes source points that have a normalized radius σr in the 0.76-0.8 range and an angular position in the 56.25-67.5° range (with respect to the quadrant shown in FIG. 4). The seventy-fifth pixel group includes three illumination source points in each quadrant.

In Tables 1 and 2, pixel groups with a normalized $\sigma_r$ radius greater than 0.98 have been excluded because typical modern illuminators cutoff at $\sigma_r \approx 0.98$.

Referring back to FIG. 2, after dividing the illumination source into pixel groups, the method then proceeds to block 203 where an initial illumination setting (e.g., illumination shape or illumination mode) is selected. The initial illumination shape includes one or more pixel groups and is chosen for its aptitude to print the features of interest in the patterning device (e.g., lines, holes, or brickwalls). The initial illumination setting may be determined either via experimentation or simulation, as will be appreciated by one of ordinary skill in the art. In at least one implementation, the initial illumination setting is configured to print the pattern with sufficient process latitude (e.g., exposure latitude and depth of focus).

The method 200 then proceeds to block 204 where the state of a pixel group is changed in the illumination source to create a modified illumination shape. The state of the pixel group may be changed by adding the pixel group to the initial illumination shape. Alternatively, the state of the pixel group may be changed by removing the pixel group from the initial illumination shape. When a pixel group is removed from the illumination shape, it does not contribute to the illumination beam. When a pixel group is added in the initial illumination shape, it contributes to the illumination beam.

Then, after changing the state of a pixel group, the method proceeds to block 205 where a lithographic metric is calculated or estimated (e.g., a characteristic of an image of the pattern) as a result of the change of state in the pixel group. The lithographic metric is a value function that is selected to estimate and/or gauge the performance of the modified illumination shape when it illuminates the pattern. More generally, the lithographic metric may also be termed a lithographic response. The lithographic metric may be, for example, a critical dimension uniformity of the printed pattern, a dimension of the process window, mask error enhancement factor (MEEF), maximum NILS or maximum NILS in defocus. It will be appreciated that additional lithographic metrics or responses may be used in an embodiment of the invention. Then, the method proceeds to block 206 where the initial illumination shape is adjusted based on a result of the calculation. After adjusting the initial illumination shape based on the result of the calculating, the method proceeds to block 207 where a determination is made as to whether a state of another pixel group should be changed. If the result of the inquiry is positive, the method proceeds back to block 204 and continues through block 206. If the result of the inquiry is negative, the method ends at block 208. As will be explained in more detail below, the operations of blocks 204, 205 and 206 may be iteratively executed for a plurality of pixel groups.

Figure 6:
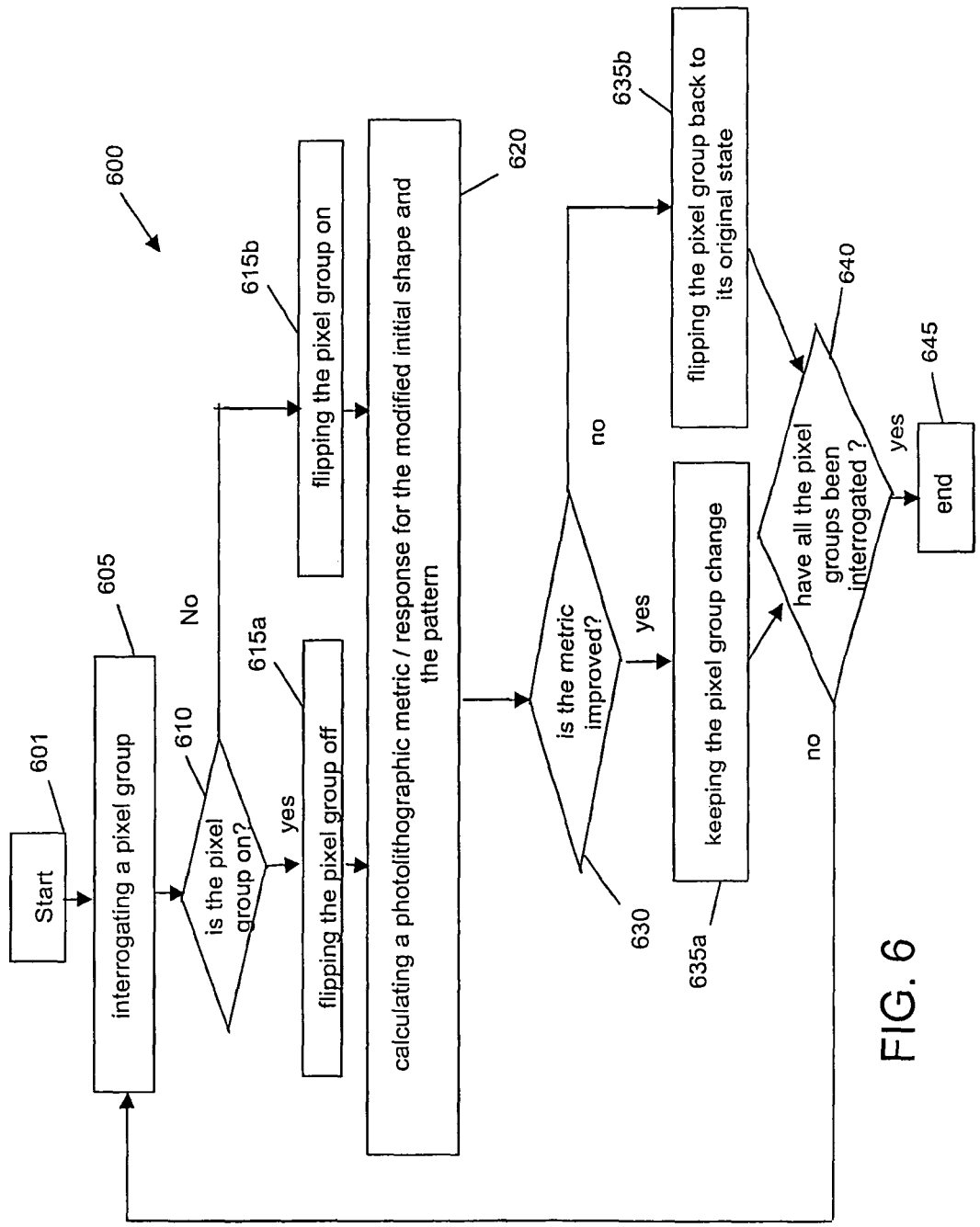
FIG. 6 shows an exemplary flowchart for configuring the illumination source in accordance with an embodiment of the invention.

Referring to FIG. 6, this figure shows a method for executing the operations of blocks 204, 205, 206 and 207 of FIG. 2, in accordance with an embodiment of the invention. In FIG. 6, the method 600 starts at block 601 and proceeds to block 605 where a first pixel group is interrogated or selected. The method then proceeds to block 610 where a determination is made as to whether the first interrogated pixel group is "on" or "off". When a pixel group is "on" (or active), it is part of the initial illumination shape and provides at least a portion of the illumination beam B. By contrast, when a pixel group is "off" (or inactive), it does not contribute to the initial illumination shape and, therefore, does not illuminate the patterning device. In the method of FIG. 6, if the first pixel is "on", it is turned "off" (block 615a), and if the first pixel is "off", it is turned "on" (block 615b). In so doing, a modified illumination shape may be obtained.

After flipping the first pixel group, the method then proceeds to block 620 where a photolithographic metric or response is calculated for the modified illumination shape or setting. In an embodiment, the photolithographic metric or response may be a critical dimension uniformity of the printed pattern, a dimension of the process window, mask error enhancement factor (MEEF), maximum NILS or maximum NILS in defocus. It will be appreciated that additional lithographic metrics or responses may be used in an embodiment of the invention. Calculation of the photolithographic metric or response may be done using photolithographic simulations.

Calculation of the photolithographic metric may involve first calculating one or more images of the pattern illuminated by the modified illumination shape. Calculation of the image(s) may be done using an aerial image model or a resist model. After calculating the image(s) of the pattern, an attribute of the calculated image(s) may be evaluated to estimate and/or gauge the performance of the modified illumination shape. In this example, the attribute corresponds to the lithographic metric or response. The photolithographic simulations calculate the photolithographic metric or response for the pattern when it is illuminated by the modified initial illumination shape. The photolithographic simulations may be performed using various models.

In at least one implementation, calculation of the photolithographic metric or response may be performed with a resist model. The resist model may take into account the resist baking and the resist developing to calculate the image of the pattern in the resist. The resist model may also take into account the non-planar topography at the surface of the substrate and the vector effects. The vector effects refer to the fact that an electromagnetic wave propagates obliquely when a high numerical aperture is used. Alternatively, a lumped parameter model or a variable threshold resist model may also be used in at least one embodiment of the invention to calculate the photolithographic metric or response. A calibrated model is a model that has been matched to experimental data.

In another implementation, an aerial image model may be used to calculate the photolithographic metric or response. Calculation of the aerial image may be done either in the scalar or vector form of the Fourier optics. The quality of the aerial image may be determined by using a contrast or normalized aerial image log-slope (NILS) metric (normalized to the feature size). This value corresponds to the slope of the image intensity (or aerial image).

Relevant parameters to perform the photolithographic simulations may include the distance from the focal plane of the Gaussian image plane, meaning the distance to the plane where the best plane of focus exists, as determined by geometrical ray optics, or the center wavelength of the quasi-monochromatic radiation source. The parameters may also include a measure of degree of spatial partial coherence of the illumination system, the numerical aperture of the projection system exposing the substrate and the aberrations of the optical system. In practice, the photolithographic simulations may be carried out with the aid of a commercially available simulator such as Prolith™, Solid-C™ or the like.

In an embodiment of the invention, the photolithographic metric may be a predicted critical dimension uniformity (CDU) of the printed pattern wherein the predicted value of the metric is calibrated to match a measured CDU of the printed pattern on the substrate. Using this embodiment may be beneficial in a lithographic manufacturing process using a patterning device (e.g. mask) wherein the patterning device (e.g. mask) has an error. Due to the patterning device error, the printed pattern on the substrate has a CDU that is different from the predicted CDU, which was calculated for a patterning device (e.g. mask) having no error. By matching the predicted CDU to the measured CDU, the effect of the patterning device error may be corrected using the flowchart of FIG. 2. This embodiment according to the invention may further be beneficial when the patterning device (e.g. mask) is manufactured within the specifications of the patterning device design but where the OPC model used to calculate OPC features on the patterning device (e.g. mask) was incorrect or not sufficiently accurate. An incorrect or not sufficiently correct OPC model may for example be obtained when scaling a pattern design containing OPC to a smaller technology node. In such a scaling process, both pattern features and OPC features are scaled to a smaller feature size. The effect of the smaller OPC features may be different than expected due to a non-linearity of the effect. By matching the predicted CDU to the measured CDU, the effect of the incorrect or inaccurate OPC model may be corrected using the flowchart of FIG. 2. Furthermore, this embodiment according to the invention may be beneficially used for correcting differences in a predicted CDU and a measured CDU caused by other process parameters that deviate from their expected setting, such as deviations in the illumination system or projection system.

Additional information regarding the calculations of an image of a patterning device (e.g., mask) pattern using photolithographic simulations may be gleaned, for example, in U.S. Pat. No. 6,839,125 issued on Dec. 16, 2004, entitled "Method for Optimizing an Illumination Source Using Full Resist Simulation and Process Window Metric" and U.S. Pat. No. 7,016,017, issued on Mar. 1, 2006, entitled "Lithographic Apparatus and Method for Optimizing an Illumination Source Using Isofocal Compensation." The contents of these two applications are incorporated herein in their entirety by reference.

The photolithographic metric or response (e.g., the imaged pattern) may be calculated over an assumed budget of process parameters (e.g., focus, dose and patterning device (e.g., mask) variation). For example, in at least one implementation, the lithographic metric or response may be calculated by adding in quadrature the variations of the metric or response due to each of the process parameters. In this example, the metric or response corresponds to the total variation of the metric for the assumed budget of process parameters.

After calculating the lithographic metric or response, the method then proceeds to block 630 where a determination is made as to whether the value of the metric or response has been improved due to the change (i.e., pixel group flipping) of the initial illumination shape. For example, if the metric or response is a critical dimension uniformity of the pattern, the determination of block 630 is whether the CD non-uniformity has been reduced or increased as a result of the change in the initial illumination shape. As another example, if the metric or response is a dimension of the process window, the determination of block 630 is whether the dimension of the process window has been reduced or increased as a result of the change in the initial illumination shape. If the result of the inquiry is positive, the change made to the first pixel group is kept (block 635a). Alternatively, if the result of the inquiry is negative, the change made to the first pixel group is ignored, and the pixel group is flipped back to its original state (i.e., if the pixel group was originally "on", it remains "on", and if the pixel group was originally "off", it remains "off".)

Then, after assessing the influence of the first pixel group on the quality of the imaged pattern by using the lithographic metric or response, a determination is made as to whether all the pixel groups have been interrogated (block 640). If the result of the inquiry is negative, the method 600 proceeds back to block 605 where a second pixel group is interrogated or selected. Then, the method proceeds again from block 610 to block 640 in a similar manner as before. This process is iteratively executed until all the selected pixel groups have been interrogated. If the result of the inquiry is negative, the method 600 ends at block 645.

Blocks 601-645, shown in FIG. 6, represent one method that may be used to calculate at least one response obtained for at least one change in the initial illumination shape. In the embodiment of FIG. 6, the response may correspond to the variation of a critical dimension of the pattern. As will be appreciated, calculations of the series of responses in FIG. 2 provide an optimized illumination setting which optimizes (e.g., maximizes or minimizes) a particular attribute (e.g., CD variations or dimension of the process window) of the photolithographic response (e.g., image pattern).

Referring back to FIG. 2, once the modified or optimized illumination shape has been determined, the process for adjusting (e.g., optimizing or configuring) the illumination source shown in FIG. 2 may be iteratively repeated. For example, after calculating the modified illumination shape at block 206, the method may proceed back to block 203, where the modified illumination setting may act as a new initial illumination setting. In this embodiment, the method proceeds from block 203 to block 206 in a similar manner as before so that a new modified or optimized illumination setting may be calculated. This process may be repeated if desired. Then, the method ends at block 208.

All the pixel groups of the illumination source or portion thereof may be interrogated. For example, only the pixel groups having a normalized radial and/or angular value greater than a predetermined value may be interrogated. As another example, only the pixel groups that are part of the illumination beam or initial illumination shape may be interrogated. In addition, it will be appreciated that various metrics, responses or attributes may be used in determining the modified illumination setting. Selection of the metric, response or attribute may be based on the geometry of the pattern that is being imaged.

Figure 7B:
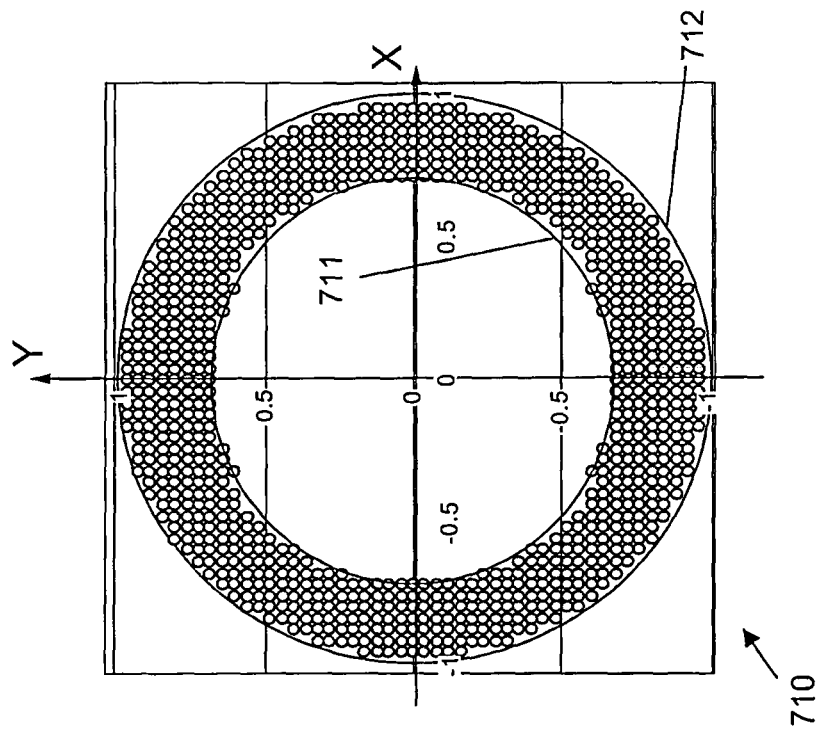
Figure 7A:
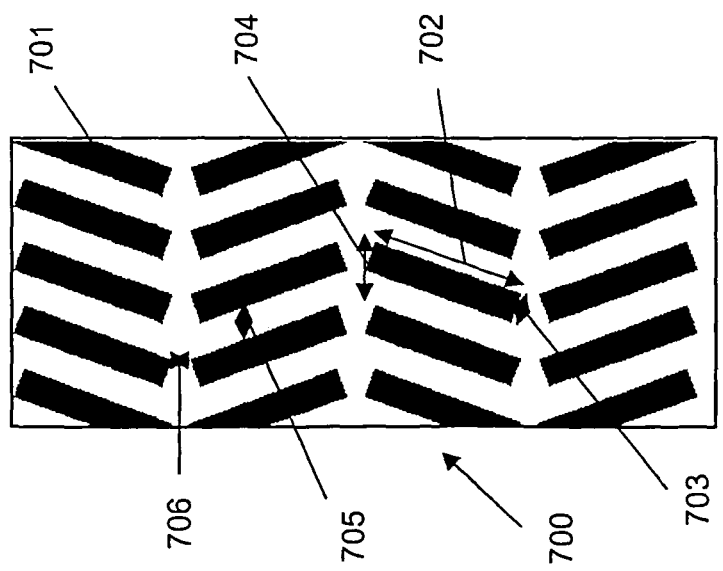
FIG. 7a shows a patterning device pattern that may be used to configure an illumination source in accordance with an embodiment of the invention.

In one implementation, the illumination source may be optimized using group pixel flipping to image the DRAM structure 700 shown in FIG. 7a. The structure 700, commonly referred to as a herringbone or chevron structure, includes a plurality of rectangles 701 that are inclined relative to each other at a particular angle. Each rectangle 701 is defined by its length 702, width 703 and bridge width 704. FIG. 7a also shows the horizontal gap 705 and the vertical gap 706 between two adjacent rectangles.

FIG. 7b shows an initial illumination setting 710 that may be used to image and print the structure 700 on the substrate. The initial shape has an annular shape having a normalized inner radius 711 ($\sigma_c$) of about 0.72 and a normalized outer radius 712 ($\sigma_r$) of about 0.98. This initial illumination shape may be initially determined based on experimental data or preliminary simulations.

In accordance with the methods of FIGS. 2 and 6, the illumination shape 710 is modified to configure or optimize the printing of pattern 700. In this configuration process, only the pixel groups having a normalized radius greater than 0.72 are being considered. These pixel groups correspond to pixel group nos. 61-117 in Table 1. In accordance with the methods of FIGS. 2 and 6, each of these pixel groups is interrogated and a determination is made as to whether the flipping of each pixel group reduces or increases the variation of the attribute. Calculation of the image of the pattern is done with a calibrated lump parameter model. Calculations are done with a 1.2 numerical aperture (corresponding to k1=0.31) and a TE polarized illumination beam. The horizontal half pitch between two adjacent rectangles is 50 nm.

In this embodiment, the metric that is being considered to gauge the influence of the pixel groups on the quality of the imaged pattern is the combination of the critical dimension uniformity of the width (CD width—703 set to 50 nm) and the critical dimension uniformity of the length (CD length—702)

of the rectangle 701. The metric that is being used to determine the influence of the pixel groups is defined in equation (2):

$$CDU\ total = (2\ CDU\ width + CDU\ length)/3 \qquad (2)$$

The metric CDU (critical dimension uniformity) total in equation (2) includes the weighted sum of the critical dimension (CD) variations of the width and the length of the pattern 701 as a function of a specified error budget.

CDU width and CDU length are determined by calculating the variations of CD width and CD length of the pattern 701. Each of the variations of CD width and CD length is calculated over an assumed budget of dose, focus and mask error with the following equation:

$$CD = \sqrt{CD_{Rfoc}^2 + CD_{Rdose}^2 + CD_{Rglobalmask}^2} \qquad (3)$$

where $CD_{Rfoc}$, $CD_{Rdose}$, and $CD_{Rglobalmask}$ correspond to the CD total variation induced by focus, dose, and mask variations, respectively, over an assumed budget. In one implementation, the assumed budget includes a 0.2 μm defocus, a 2% variation dose and a 1 nm mask size error. In one embodiment, the critical dimension of the bridging width at 5% underexposure may be used as an additional process error and combined into the total CDU metric. The CD variation as defined in equation (3) substantially represents the full CD variation range of the pattern printed on the substrate and, as such, approximates the six sigma statistical variation range. Thus, half of the value of the CD total variation (also termed as CD variation half range) substantially approximates the normally used three sigma CD uniformity (CDU).

Figure 7C:
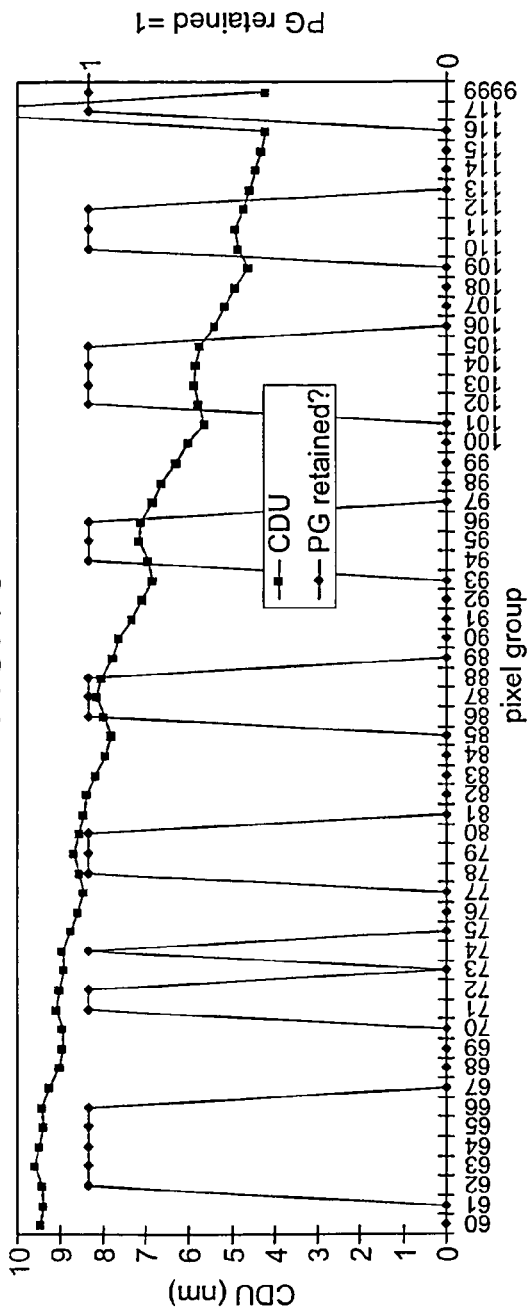
FIG. 7c shows the variation of CD uniformity as a function of pixel group position in the illumination source of FIG. 7b.

Referring to FIG. 7c, this figure shows the influence of some pixel groups on the critical dimension uniformity (CDU) that is calculated with equation (2). In FIG. 7c, when a pixel group is retained, it is set to "1". As can be seen in this figure, CDU is improved when pixel groups 60 and 61 are removed. As a result, these pixel groups are removed from the illumination setting. By contrast, CDU degrades when pixel groups 62-66 are removed. As a result, these pixel groups are returned to the illumination setting. This process continues for the remaining pixel groups 67-117. Each time a pixel group degrades CDU, it is removed from the illumination setting. Each time a pixel group improves CDU, it is kept in the illumination setting. As can be seen in FIG. 7c, CDU is significantly improved as the pixel groups that degrade CDU are removed. In FIG. 7c, the CDU of the imaged pattern is improved by at least a factor of two with the new illumination setting.

Figure 7D:
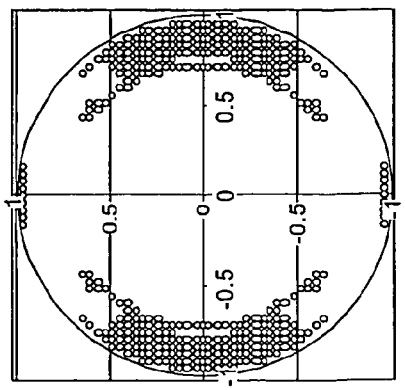
FIG. 7d shows an illumination source that has been optimized with the method of FIG. 2.

FIG. 7d shows the illumination setting after interrogating pixel group nos. 60-117. As can be seen in FIG. 7d, the initial source has been significantly altered by the optimization process of FIGS. 2 and 6.

Figure 7E:
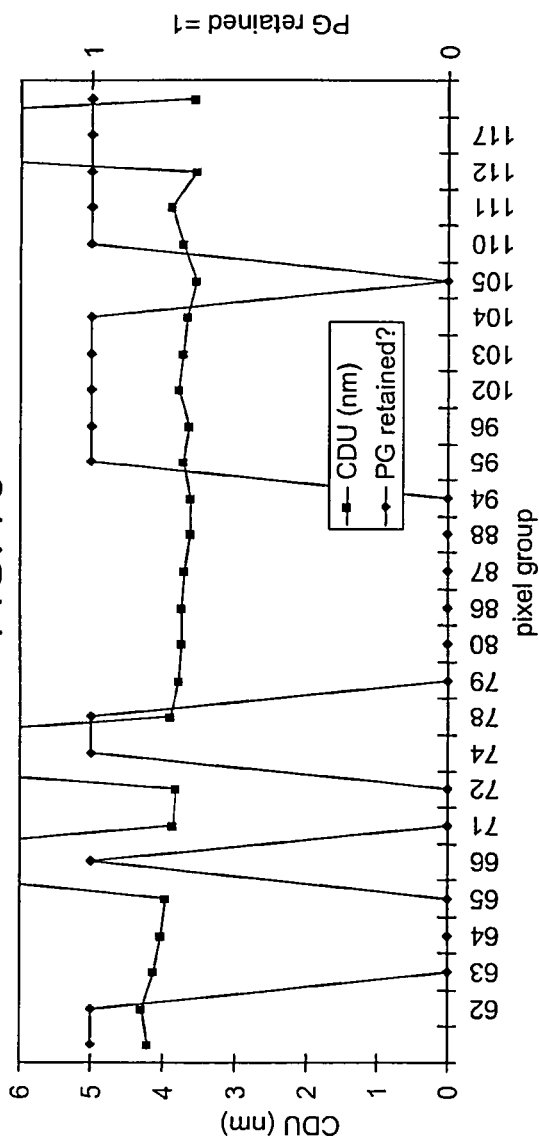
FIG. 7e shows the variation of CD uniformity as a function of pixel group position in the illumination source of FIG. 7d.
Figure 7F:
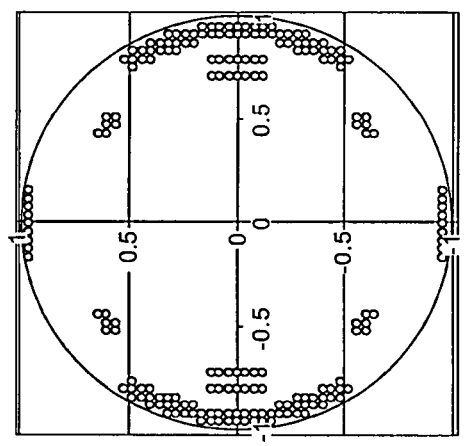
FIG. 7f shows an illumination source that has been optimized with the method of FIG. 2.

It is also possible to repeat this optimization process and use the modified illumination shape as an initial illumination shape in order to refine the optimized illumination shape. FIG. 7e shows the variation of CDU as a function of the pixel groups that were retained after the first pass (see FIG. 7c). As shown in FIG. 7e, some of the pixel groups (PG), which were originally retained after the first pass, are now excluded from the new refined illumination shape. The refined illumination shape is shown in FIG. 7f. Additional passes may be performed to further refine the illumination shape. In practice, these separate passes can be combined into a single continuous process leading to an optimal result.

Figure 8A:
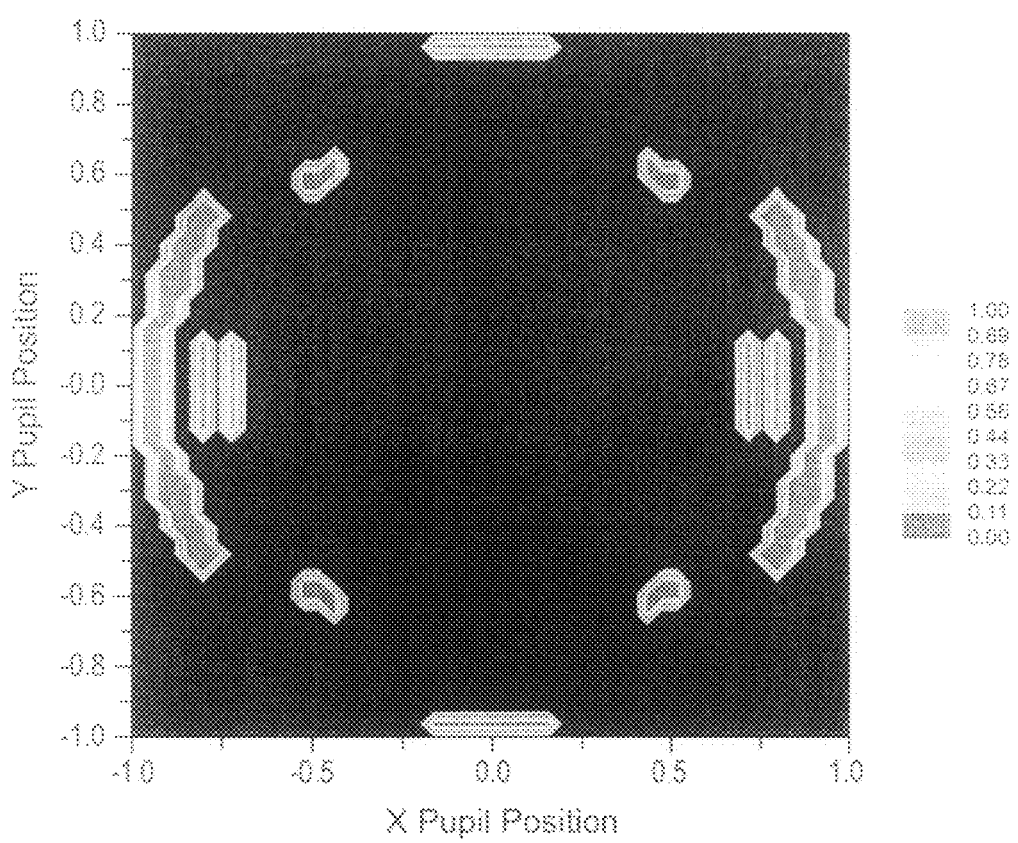
FIGS. 8a-b show the illumination source of FIG. 7f as viewed by a simulation software and after a 0.05 Gaussian treatment.
Figure 8B:
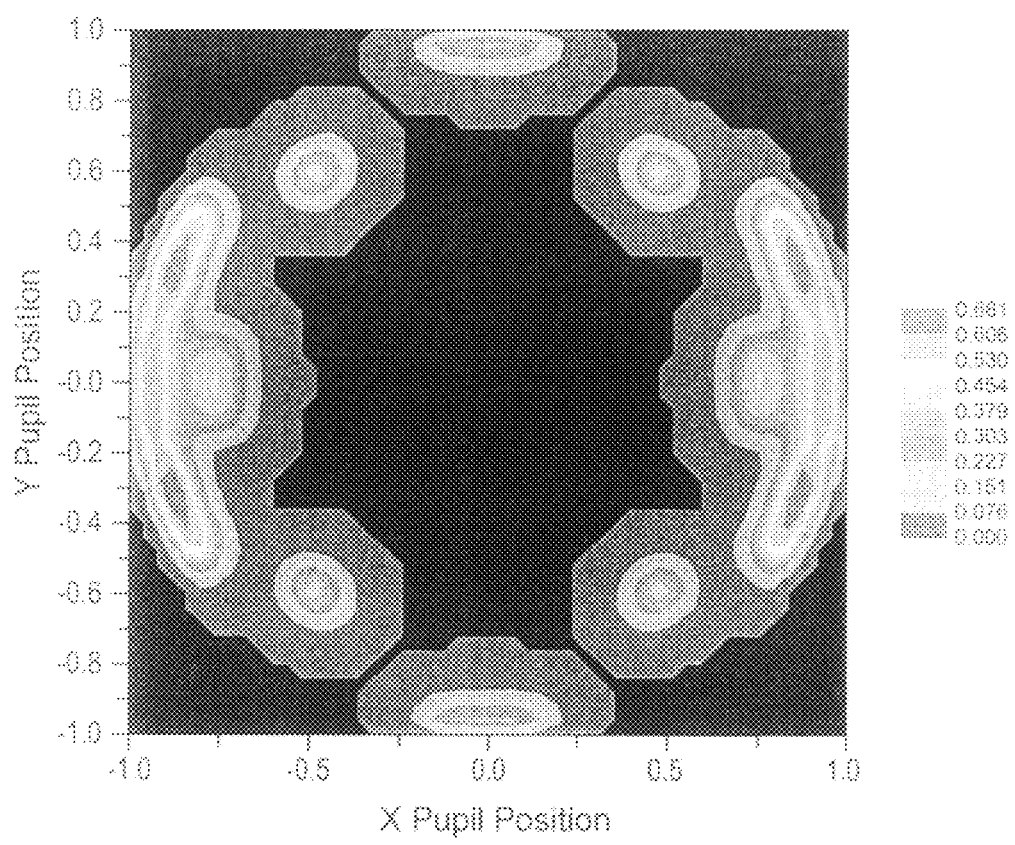

As shown in FIG. 7f, the refined illumination shape includes sharp edges that may be, in practice, difficult to create. In one implementation, the final illumination shape may further be refined with an appropriate software to soften its sharp edges to make the simulation more representative of the actual implementation in a scanner. For example, the final illumination shape may be convoluted with a Gaussian function to soften the sharp edges. FIG. 8a shows the optimum source as viewed by the simulation software Prolith™ in the pupil plane of the illumination system. FIG. 8b shows the optimum illumination shape after being convoluted with a Gaussian function. FIGS. 8a-b also show the intensity of the illumination portions.

While only the pixel groups included in the initial annular illumination shape (pixel groups with σr≥0.72) have been considered in FIGS. 7a-f, it will be appreciated that additional pixel groups may also be considered to configure the illumination shape. For example, pixel groups corresponding to σr<0.72 could also be considered in at least one embodiment of the invention. In addition, it will be appreciated that pixel groups may be interrogated/selected either randomly or with a predetermined order. In FIGS. 7c and 7e, pixel groups are interrogated/selected as a function of an increase in radius. Alternatively, the pixel groups could be interrogated/selected as a function of a decrease in radius. It will be appreciated that any combination of the above could be used to interrogate/select the pixel groups.

Figure 9A:
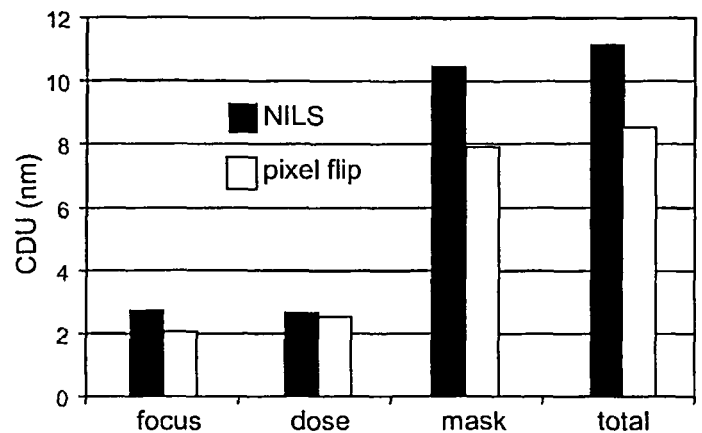
FIGS. 9a-b show the critical dimension uniformity CDU of, respectively, the vertical and horizontal gaps of the pattern shown in FIG. 7a obtained with (a) an illumination setting configured in accordance with the method of FIG. 2 and (b) an illumination setting configured with a conventional aerial image simulation.
Figure 9B:
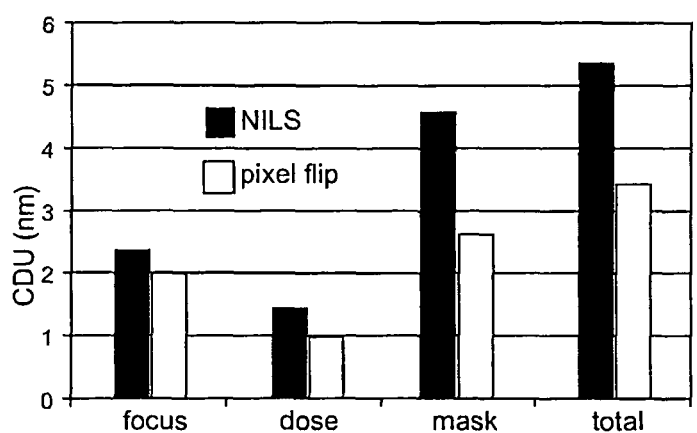
Figure 9C:
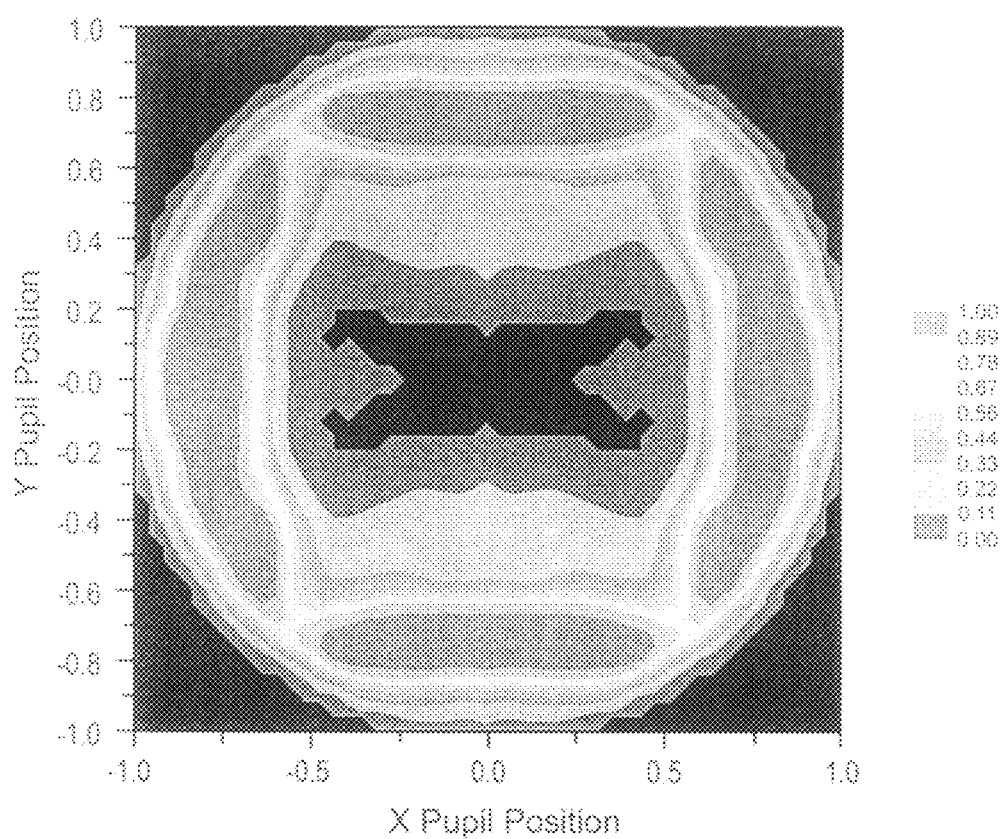
FIG. 9c shows the illumination source configured with a conventional aerial image simulation.

Referring now to FIGS. 9a-b, these figures show the critical dimension uniformity CDU of the vertical and horizontal gaps 706, 705, respectively, obtained with (a) an illumination shape configured in accordance with the method of FIG. 2 (see FIG. 8b) (referred to as "pixel flip" in FIG. 9a) and (b) an illumination shape optimized using conventional aerial image simulation (e.g., using a NILS metric and referred to as "NILS" in FIG. 9b). For reference, the illumination shape optimized with a conventional aerial image simulation is shown in FIG. 9c. CDU results are shown for an assumed budget of errors (mask size, focus and dose). The total CDU variation that results from the combination of these errors is also shown in FIGS. 9a-b. In FIGS. 9a-b, results are provided for the following assumed budget: 200 nm focus variation, 2 nm mask variation and 2% dose variation. Calculations are done with a 0.93 numerical aperture (corresponding to k1=0.35), a X+Y polarized illumination beam and a 6% attenuated phase shift mask. A calibrated lump parameter model is used in the pixel flipping optimization and in the subsequent comparison of the two methods.

As can be seen in FIGS. 9a-b, the critical dimension uniformity of both the horizontal and vertical gaps 705,706 are significantly reduced when the pattern is illuminated with an illumination shape that is configured in accordance with the method of FIG. 2. The CD control of the rectangles 701 is much improved for each error (i.e., focus, mask and dose).

Figure 10:
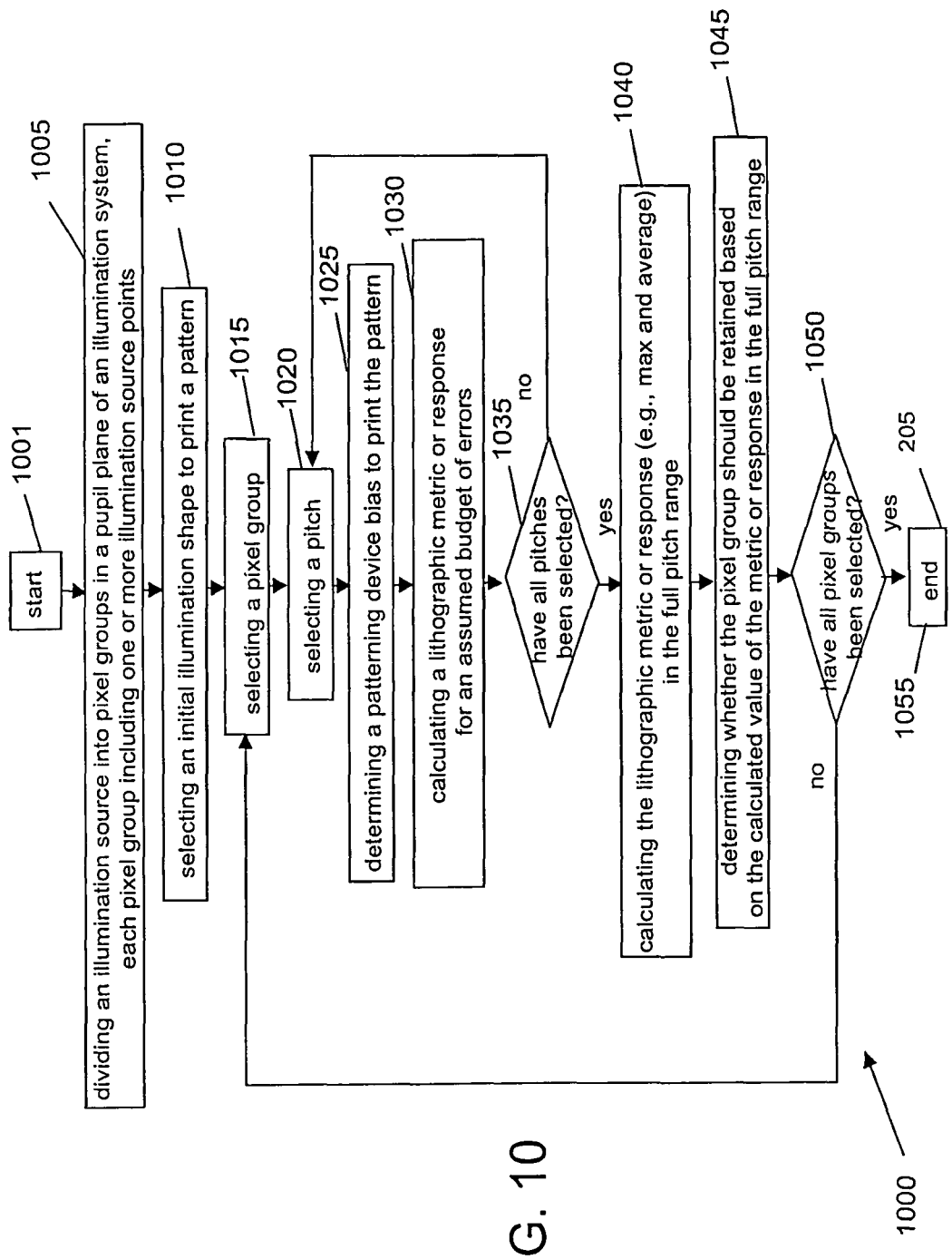
FIG. 10 shows an exemplary flowchart for configuring the illumination source in accordance with an embodiment of the invention.

In one embodiment, the method of FIG. 2 is modified to configure or optimize the illumination shape for a situation where several pitches should be optimally printed simultaneously. For example, referring to FIG. 10, this figure shows a method for configuring an illumination source in accordance with an embodiment of the invention. The method 1000 of FIG. 10 is adapted to configure the illumination shape for different pattern pitches. The method begins at block 1001 and proceeds to block 1005 and 1010 in the same way as in FIG. 2. That is, at block 1005 the illumination source is divided into pixel groups in the pupil plane of the illumination system. Each pixel group includes one or more illumination source points. At block 1010, an initial illumination shape is selected. The initial illumination shape may be determined either via experimentation or simulation, as will be appreciated by one of ordinary skill in the art. In at least one implementation, the initial illumination shape is configured to print the pattern with sufficient process latitude (e.g., exposure latitude and depth of focus) at various pitches.

After selecting the initial illumination source, the method proceeds to blocks 1015 and 1020, where, respectively, a first pixel group is selected or interrogated and a first pitch is selected. At block 1015, the method proceeds in a similar manner as in FIG. 6. Specifically, a determination is made as to whether the first interrogated pixel group is "on" or "off". When a pixel group is "on" (or active), it is part of the initial illumination shape and contributes to the illumination beam. By contrast, when a pixel group is "off" (or inactive), it is not part of the initial illumination shape and, therefore, does not illuminate the patterning device. In the method of FIG. 10, if the interrogated pixel is "on", it is turned "off", and if the interrogated pixel is "off", it is turned "on". In so doing, a modified illumination shape may be obtained.

The method then proceeds to block 1025 where the patterning device bias, which may be required to print the pattern to the correct size, is determined. This variable bias is desirable because for an assumed dose or image threshold the correct bias is both source and pitch dependent. As will be appreciated, this bias may be calculated by photolithographic simulations. Alternatively, instead of calculating a bias at block 1025, it is also possible to determine the desired dose to print the pattern to the target size at a fixed bias. This dose is commonly known as the dose to size E1:1 and may also be determined using photolithographic simulations. For an image calculation rather than E1:1, the appropriate image threshold must be selected.

After determining the patterning device bias or the dose to size E1:1, the method then proceeds to block 1030 where a lithographic metric or response of the pattern for an assumed budget of errors is calculated. In one implementation, the metric or response that is considered to gauge the performance of the illumination source is a critical dimension uniformity of the pattern. It will be appreciated that alternative metrics may also be used. Typically, at block 1030, the method calculates an image of the pattern (with, e.g., an aerial or resist model). Then, an attribute or metric of the imaged pattern (e.g., CD uniformity over an assumed error budget) is calculated, in a similar manner as in FIG. 6. The assumed budget of errors may include mask error (size), dose and focus errors, and other important error contributors, depending on the nature of the problem. The value of the attribute induced by the assumed budget may then be obtained for the first pitch.

Then, after obtaining the total variation of the attribute over an assumed budget of errors, the method proceeds to block 1040 where a determination is made as to whether all the pitches have been considered. If the result of the inquiry is negative, the method proceeds back from block 1020, where a second pitch is selected, to blocks 1025 and 1030. If the result of the inquiry is positive, the method proceeds to block 1040 where the metric is calculated for the full pitch range. For example, if the metric is critical dimension uniformity (CDU), the maximum and average variation of the critical dimension uniformity (CDU) may be calculated.

Then, the method proceeds to block 1045 where a determination is made as to whether the flipping of the pixel group selected at block 1015 improves or degrades the variation of the attribute. For example, if the first pixel group reduces the average and/or maximum of the metric (e.g., critical dimension uniformity (CDU) of the imaged pattern) over the pitch range, the first pixel group is retained. By contrast, if the first pixel group increases the average and/or maximum of the metric (e.g., critical dimension uniformity of the imaged pattern) over the pitch range, the first pixel group is flipped back to its original state (i.e., if the first pixel group is "on", it is turned "off", and if the first pixel group is "off" it is turned "on").

After determining the influence of the pixel group on the quality of the imaged pattern, the method proceeds to block 1050 where a determination is made as to whether all the pixel groups have been considered. If the result of the inquiry is negative, the method proceeds back to block 1015 where a second pixel group is selected. If the result of the inquiry is positive, the method ends at block 1055. The user may choose to loop through the pixel groups multiple times, or apply specific selection criteria, until a true convergence is obtained.

Figure 11A:
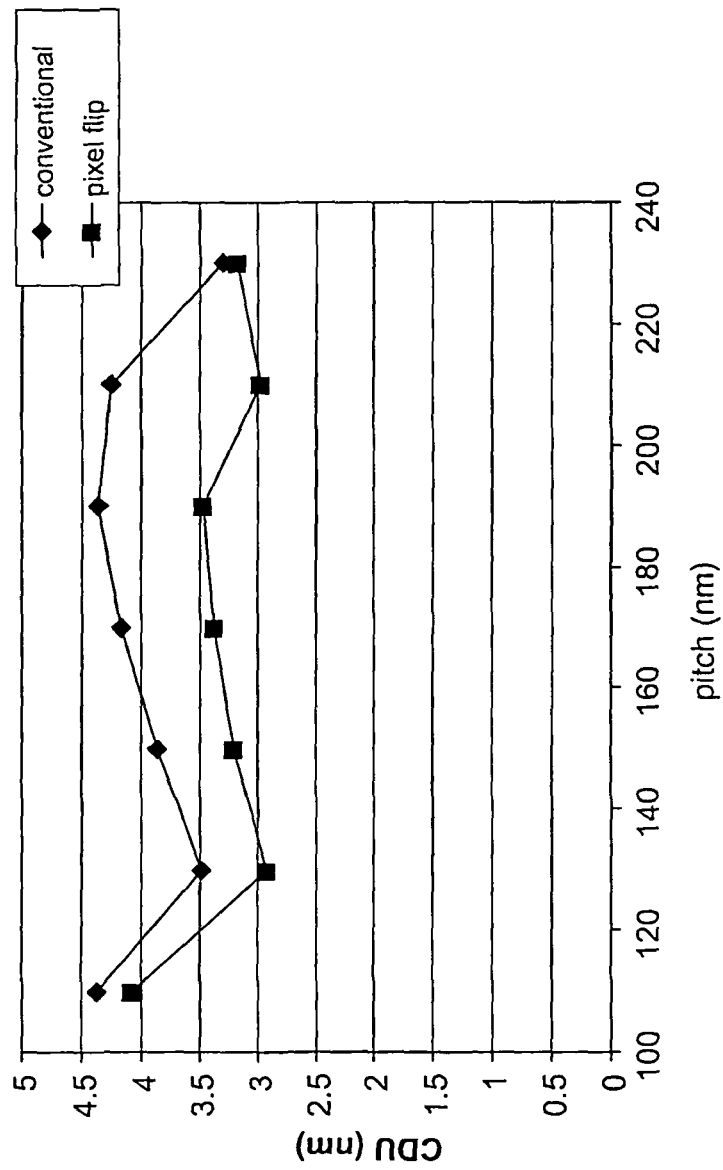
FIG. 11a shows the variation of the critical dimension uniformity CDU of a pattern of holes as a function of pitch obtained with (a) an illumination source configured in accordance with the method of FIG. 10 and (b) an illumination source configured with a parametrically-constrained source shape optimization.
Figure 11B:
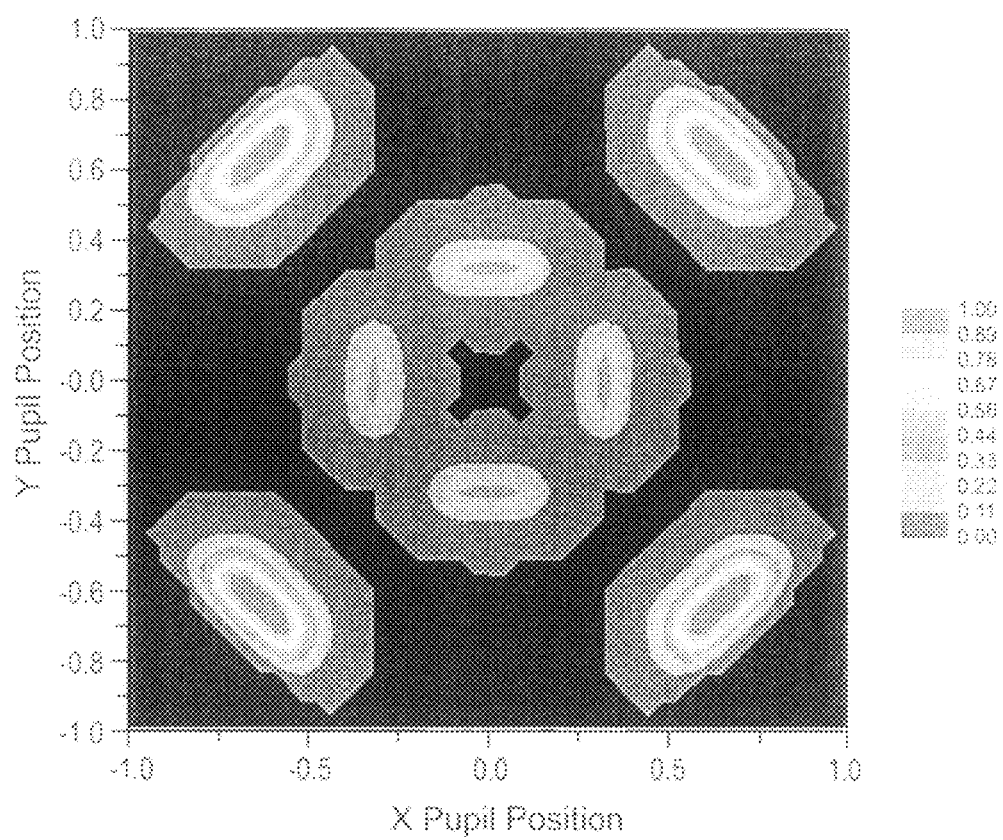
FIGS. 11b-c show, respectively, the illumination shape optimized in accordance with the method of FIG. 10 and the second illumination source optimized with a parametrically-constrained source shape optimization.
Figure 11C:
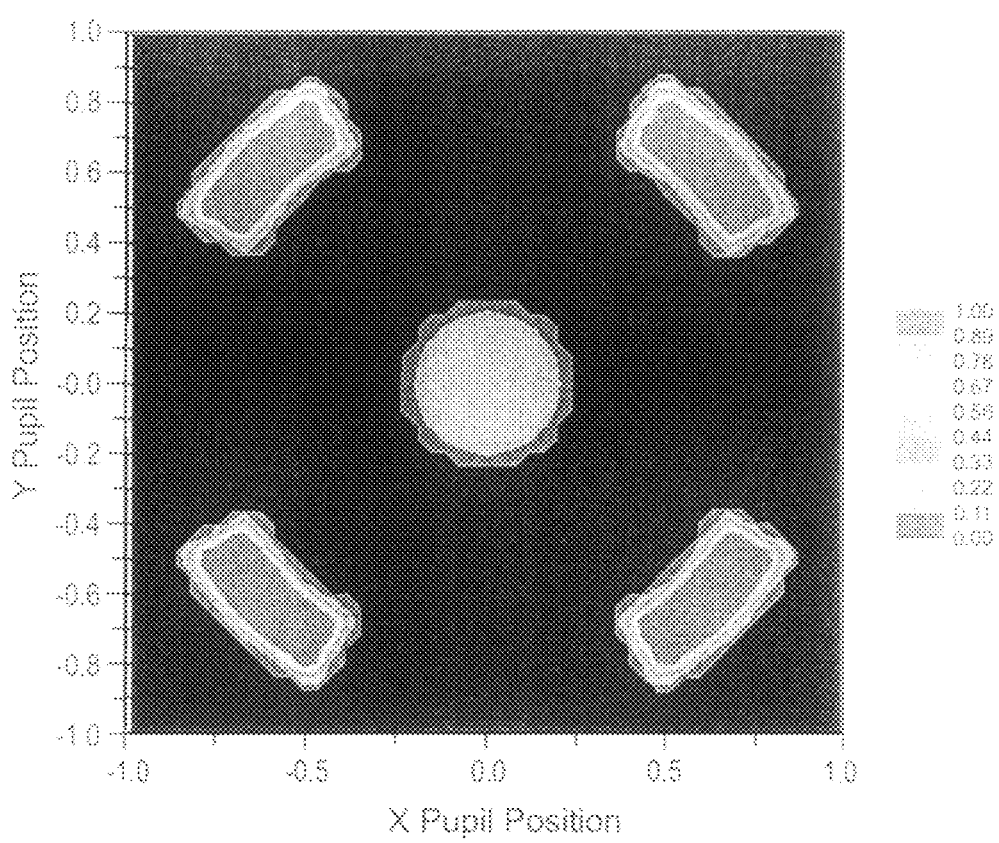

FIG. 11a shows the variation of the critical dimension as a function of pitch for a first illumination shape optimized in accordance with the method of FIG. 10 (referred to as "pixel flip" in FIG. 11a) and a second illumination source optimized with a conventional optimization method (referred to as "conventional" in FIG. 11a) which used a similar metric and the same calibrated model but a simple parametric source shape. FIGS. 11b-c show, respectively, the first illumination shape optimized in accordance with the method of FIG. 10 and the second illumination source optimized with a conventional optimization method. The pattern considered is a pattern of 65 nm holes arranged in 110, 130, 150, 170, 190, 210 and 230 pitches. Calculations are made with a 20% attenuated phase shift mask, a 193 nm radiation wavelength and a 0.93 numerical aperture. The metric or attribute considered to configure the illumination source is the critical dimension uniformity of the holes. The selected metric, response or attribute to gauge the quality of the illumination shape is shown in equation (4):

$$CDU = \left( \frac{\sum_{i=1}^{n} CDU_i}{n} + CDU_{worsthole} \right) / 2 \quad (4)$$

Where n represents the total number of holes.

Calculations of the metric are made for an assumed budget of focus (0.12 μm), dose (2%) and mask size (2 nm). The total CDU estimated for each hole is obtained by adding in quadrature the influence of each individual budgeted error on that hole's CDU.

As can be seen in FIG. 11a, the CD uniformity is significantly improved through the entire pitch range when the illumination source is optimized in accordance with the method of FIG. 10 (referred to as "pixel flip" in FIG. 11a).

In an embodiment, a similar approach may be used to configure an illumination source for a plurality of different patterns. It will be appreciated that the multiple pitch problem is just an example of the more general case of multiple patterns. Thus, instead of performing the calculations for different pitches of a same pattern, the calculations may be performed for different patterns in a similar manner as the method of FIG. 10.

Figure 12:
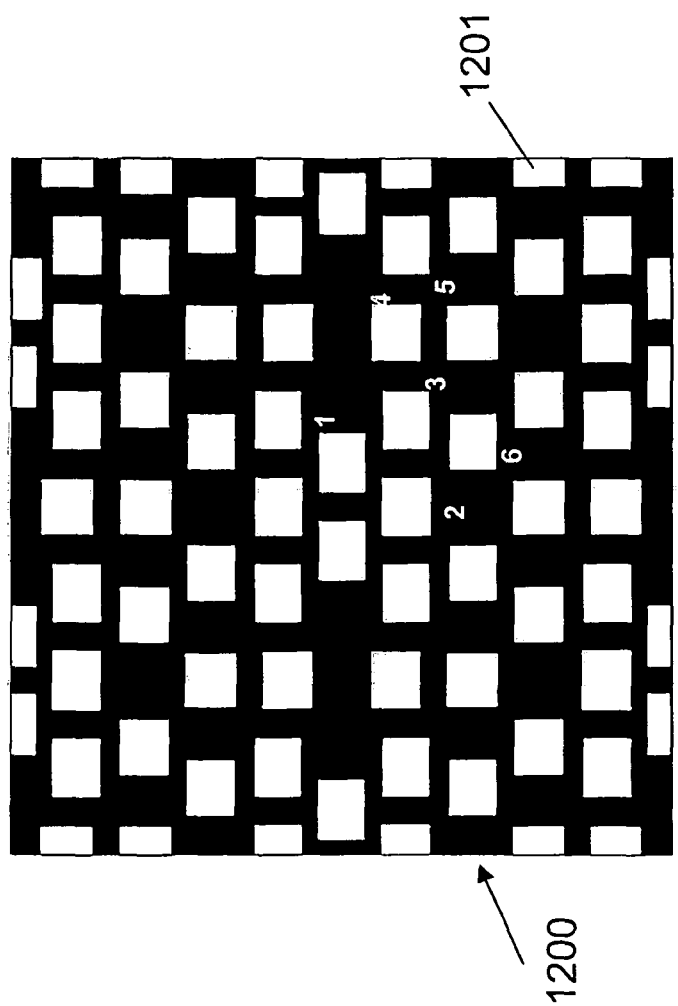
FIG. 12 shows a complex pattern of holes that represents a difficult current imaging problem; a solution for imaging this pattern may be found by configuring an illumination source in accordance with an embodiment of the invention.

Optimization of the illumination conditions to print complex patterns may also be determined in accordance with the method of FIG. 2. FIG. 12 shows an example of a complex pattern 1200. This pattern includes a series of holes 1201 arranged with different pitches. In one implementation, block 204 of FIG. 2 includes determining an initial dose to size for a selected hole at fixed bias, calculating the horizontal and vertical biases for a plurality of holes (e.g., holes 1-6 of FIG. 12) to print all holes to target size, calculating the CD range induced by an assumed budget of focus, dose and mask size errors and adding the CD errors in quadrature to obtain a total CD error. This process may be iterated, in a similar manner as in FIG. 6, over some or all the pixel groups to refine the initial illumination shape.

In one implementation, the order of selection of the pixel groups may be chosen so as to provide a lithographic process that is substantially isofocal over a predetermined range of defocus. For some patterns, different parts of the illumination system bring different benefits. For example, for a pattern of small trenches, a small sigma illumination (i.e., a circular illumination located at the center of the illumination system), provides good exposure latitude but poor depth of focus. By contrast, the outer portion of the illumination system generally provides a better depth of focus for this pattern. Therefore, it may be desirable to consider both the influence of the outer and inner portions of the illumination system when configuring or optimizing the illumination source. Additional information regarding the concept of isofocal compensation may be gleaned, for example, in U.S. Pat. No. 7,016,017, issued on Mar. 1, 2006, entitled "Lithographic Apparatus and Method for Optimizing an Illumination Source Using Isofocal Compensation." The contents of this application are incorporated herein in their entirety by reference.

In order to configure the illumination source in accordance with one embodiment of the invention, all the pixel groups are flipped "on". Thus, the initial source corresponds to a full circular illumination with a normalized radius σ=1. Then, the pixel group positioned at the middle of the illumination is first selected (i.e., it is turned "off"). For example, if the total number of pixel groups is 60 (4 symmetry planes—Table 2), the first pixel group is pixel group no. 30. If the total number of pixel groups is 117 (2 symmetry planes—Table 1), the first pixel group is pixel group no. 58 or 59. Then, the influence of the first pixel group on the quality of the imaged pattern is determined in a similar manner as in FIG. 6. That is, a lithographic metric (e.g. the variation of a critical dimension of the imaged pattern) is calculated over an assumed budget of errors to determine whether the first pixel group should be retained (i.e., kept "off") or flipped back to its original state (i.e., "on"). Then, the remaining pixel groups are successively and alternatively interrogated/selected nearer the center (e.g. pixel group no. 29) then farther from the middle (e.g., pixel group no. 31). Tables 3 and 4 show examples of the order of selection of the pixel groups for a two symmetry plane configuration (table 3) and a four symmetry plane configuration (table 4), respectively.

TABLE 4

| Selection | Pixel Group |
|---|---|
| 1 | 58 |
| 2 | 57 |
| 3 | 59 |
| 4 | 56 |
| 5 | 60 |
| 6 | 55 |
| 7 | 61 |
| 8 | 54 |
| 9 | 62 |
| 10 | 53 |
| 11 | 63 |
| 12 | 52 |
| 13 | 64 |
| 14 | 51 |
| 15 | 65 |
| 16 | 50 |
| 17 | 66 |
| 18 | 49 |
| 19 | 67 |

TABLE 4-continued

| Selection | Pixel Group |
|---|---|
| 20 | 48 |
| 21 | 68 |
| 22 | 47 |
| 23 | 69 |
| 24 | 46 |
| 25 | 70 |
| 26 | 45 |
| 27 | 71 |
| 28 | 44 |
| 29 | 72 |
| 30 | 43 |
| 31 | 73 |
| 32 | 42 |
| 33 | 74 |
| 34 | 41 |
| 35 | 75 |
| 36 | 40 |
| 37 | 76 |
| 38 | 39 |
| 39 | 77 |
| 40 | 38 |
| 41 | 78 |
| 42 | 37 |
| 43 | 79 |
| 44 | 36 |
| 45 | 80 |
| 46 | 35 |
| 47 | 81 |
| 48 | 34 |
| 49 | 82 |
| 50 | 33 |
| 51 | 83 |
| 52 | 32 |
| 53 | 84 |
| 54 | 31 |
| 55 | 85 |
| 56 | 30 |
| 57 | 86 |
| 58 | 29 |
| 59 | 87 |
| 60 | 28 |
| 61 | 88 |
| 62 | 27 |
| 63 | 89 |
| 64 | 26 |
| 65 | 90 |
| 66 | 25 |
| 67 | 91 |
| 68 | 24 |
| 69 | 92 |
| 70 | 23 |
| 71 | 93 |
| 72 | 22 |
| 73 | 94 |
| 74 | 21 |
| 75 | 95 |
| 76 | 20 |
| 77 | 96 |
| 78 | 19 |
| 79 | 97 |
| 80 | 18 |
| 81 | 98 |
| 82 | 17 |
| 83 | 99 |
| 84 | 16 |
| 85 | 100 |
| 86 | 15 |
| 87 | 101 |
| 88 | 14 |
| 89 | 102 |
| 90 | 13 |
| 91 | 103 |
| 92 | 12 |
| 93 | 104 |
| 94 | 11 |
| 95 | 105 |
| 96 | 10 |

TABLE 4-continued

| Selection | Pixel Group |
|---|---|
| 97 | 106 |
| 98 | 9 |
| 99 | 107 |
| 100 | 8 |
| 101 | 108 |
| 102 | 7 |
| 103 | 109 |
| 104 | 6 |
| 105 | 110 |
| 106 | 5 |
| 107 | 111 |
| 108 | 4 |
| 109 | 112 |
| 110 | 3 |
| 111 | 113 |
| 112 | 2 |
| 113 | 114 |
| 114 | 1 |
| 115 | 115 |
| 116 | 116 |
| 117 | 117 |

TABLE 5

| Selection | Pixel Group |
|---|---|
| 1 | 30 |
| 2 | 29 |
| 3 | 31 |
| 4 | 28 |
| 5 | 32 |
| 6 | 27 |
| 7 | 33 |
| 8 | 26 |
| 9 | 34 |
| 10 | 25 |
| 11 | 35 |
| 12 | 24 |
| 13 | 36 |
| 14 | 23 |
| 15 | 37 |
| 16 | 22 |
| 17 | 38 |
| 18 | 21 |
| 19 | 39 |
| 20 | 20 |
| 21 | 40 |
| 22 | 19 |
| 23 | 41 |
| 24 | 18 |
| 25 | 42 |
| 26 | 17 |
| 27 | 43 |
| 28 | 16 |
| 29 | 44 |
| 30 | 15 |
| 31 | 45 |
| 32 | 14 |
| 33 | 46 |
| 34 | 13 |
| 35 | 47 |
| 36 | 12 |
| 37 | 48 |
| 38 | 11 |
| 39 | 49 |
| 40 | 10 |
| 41 | 50 |
| 42 | 9 |
| 43 | 51 |
| 44 | 8 |
| 45 | 52 |
| 46 | 7 |
| 47 | 53 |

TABLE 5-continued

| Selection | Pixel Group |
|---|---|
| 48 | 6 |
| 49 | 54 |
| 50 | 5 |
| 51 | 55 |
| 52 | 4 |
| 53 | 56 |
| 54 | 3 |
| 55 | 57 |
| 56 | 2 |
| 57 | 58 |
| 58 | 1 |
| 59 | 59 |
| 60 | 60 |

It will be appreciated that a different order of selection for the pixel groups may be chosen in another embodiment of the invention.

Figure 13A:
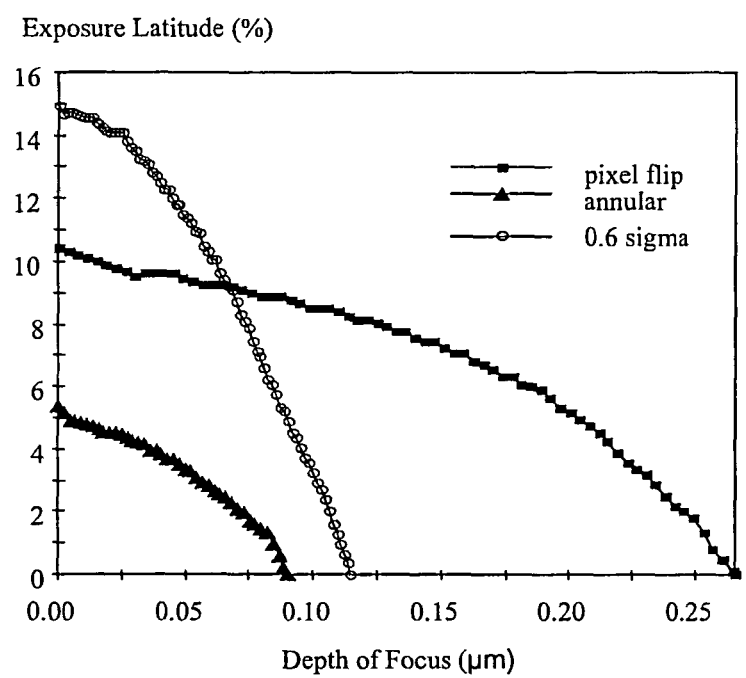
FIG. 13a shows the variation of exposure latitude as a function of depth of focus for a pattern of 75 nm isolated trenches and for (a) a source optimized in accordance with the method of FIG. 2 using isofocal compensation, (b) a circular illumination source ($\sigma_r$=0.6) and (c) an annular illumination source ($\sigma_c$=0.6; $\sigma_r$=0.9)
Figure 13B:
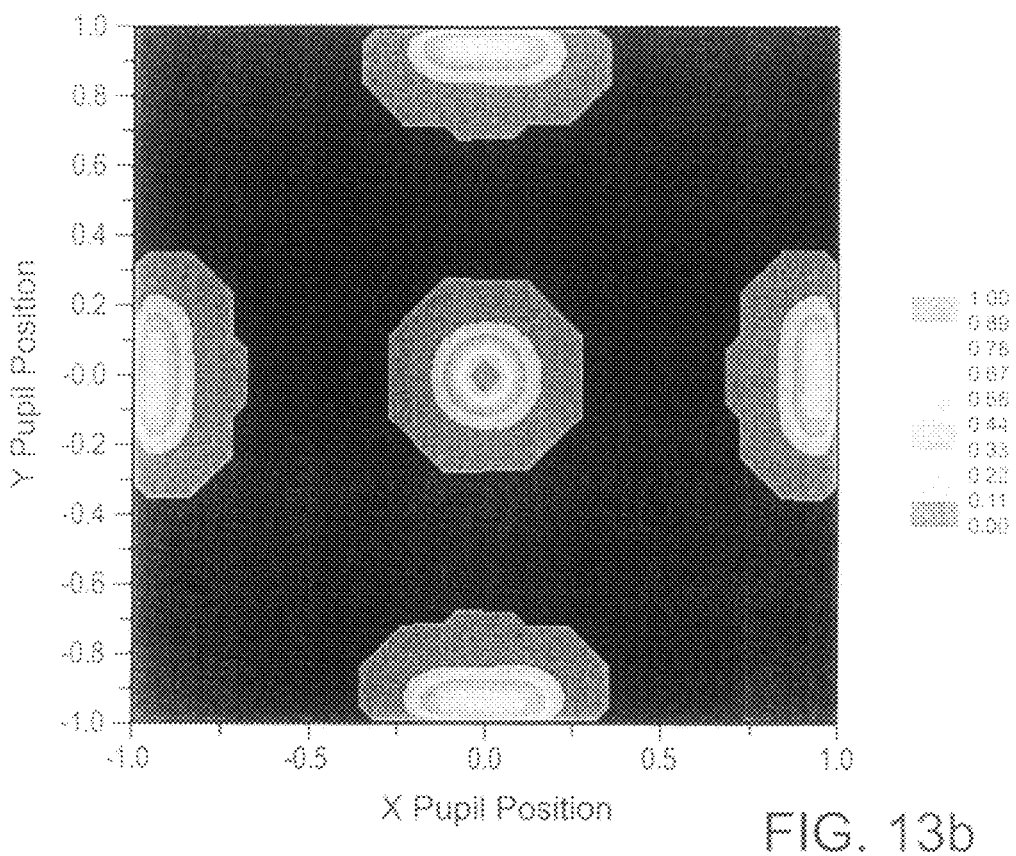
FIG. 13b shows the illumination source optimized in accordance with the method of FIG. 2 using isofocal compensation, in accordance with an embodiment of the invention.
Figure 13C:
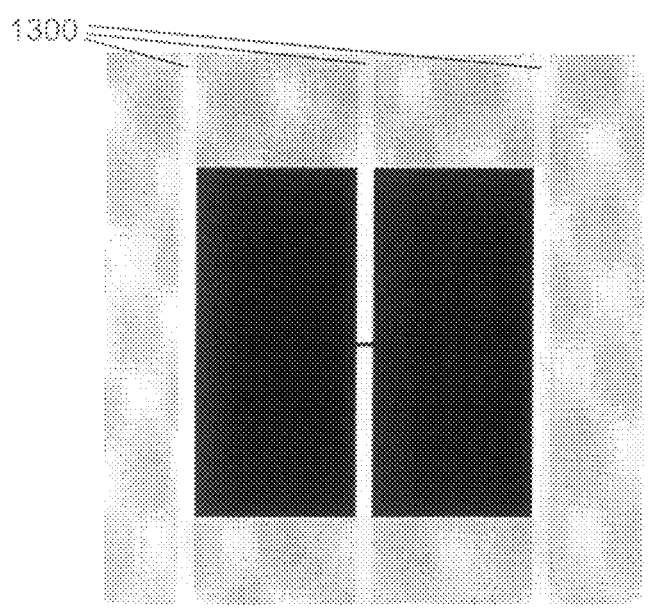
FIG. 13c shows a pattern of 75 nm isolated trenches.

Referring to FIG. 13a, this figure shows the variation of exposure latitude as a function of depth of focus for (a) a source configured in accordance with the method of FIG. 2 using isofocal compensation, (b) a circular illumination source ($\sigma_r=0.6$) and (c) an annular illumination source ($\sigma_c=0.6$; $\sigma_r=0.9$). For reference, the source optimized in accordance with the method of FIG. 2 using isofocal compensation is shown in FIG. 13b. This source includes a small circular sigma pole and four poles arranged along the X and Y pupil axes. Calculations are done for a 75 nm trench, a 15 nm patterning device bias, a 6% attenuated phase shift mask, a 193 nm radiation wavelength and a 0.93 numerical aperture. FIG. 13c shows the pattern of 75 nm trenches 1300 used in the calculation.

The circular illumination source ($\sigma_r=0.6$) and an annular illumination source are two potential illumination sources that would be conventionally selected to expose this trench. However, as can be seen in FIG. 13a, the configuration or optimization of the illumination source in accordance with FIG. 2 using the principle of isofocal compensation significantly improves the exposure latitude as compared to the conventional sources.

It will be appreciated that pixel groups including illumination source points having a normalized radial position greater than 1, i.e., $\sigma_r>1$, may also be considered to configure or optimize the illumination shape. For illumination source points having a normalized radial position greater than 1 ($\sigma_r>1$), "normal" imaging cannot occur because the projection system PS does not transmit any zero$^{th}$ order diffracted beam generated by the illumination beam B. However, imaging with high diffraction orders may be possible, and the information contained in these high diffraction orders may be used beneficially to print some features. This type of imaging may be referred to as imaging using dark-field illumination, named analogously to dark field microscopy, in reference to the fact that the zero$^{th}$ diffraction order is not collected by the projection system. It will be appreciated that the concept "dark-field illumination" in the present application is defined independently from the commonly used concepts of dark-field mask patterns and bright-field mask patterns. It is proposed in one embodiment of the present invention to configure or optimize the illumination shape with group pixels having a normalized radial position greater than 1, i.e., $\sigma>1$ It will also be appreciated that additional metrics, attributes, responses or parameters may be used in configuring or optimizing the illumination source using group pixel flipping. For example, in one embodiment of the invention, consideration may be given to the influence of the selected group pixel on the heating of an optical element (e.g., a lens). Specifically, in one configuration, the incremental effect of each excluded pixel group on the heating of a selected optical element may be determined. Additional metrics, attributes, responses or parameters may also be used in other embodiments of the invention to configure the illumination shape.

It will be appreciated that the different acts involved in configuring the illumination source may be executed according to machine executable instructions or codes. These machine executable instructions may be embedded in a data storage medium, e.g., of a control unit of the lithographic apparatus. The control unit may include a processor that is configured to control the adjusting device AM and to modify the cross-sectional intensity distribution in the beam exiting the illumination system IL. The processor may be configured to execute the instructions.

While much of the description has been in terms of optimization, optimization need not be performed all or part of the time or for all parts of the illumination and/or pattern/patterning device. For example, the source optimization may be performed completely or partially "sub-optimally" for expedience, due to imaging requirements, for parts of the patterning device/pattern, etc.

Software functionalities of a computer system involving programming, including executable codes, may be used to implement the above described imaging model. The software code may be executable by a general-purpose computer. In operation, the code and possibly the associated data records may be stored within a general-purpose computer platform. At other times, however, the software may be stored at other locations and/or transported for loading into an appropriate general-purpose computer system. Hence, the embodiments discussed above involve one or more software or computer products in the form of one or more modules of code carried by at least one machine-readable medium. Execution of such codes by a processor of the computer system enables the platform to implement the functions in essentially the manner performed in the embodiments discussed and illustrated herein.

As used herein, terms such as computer or machine "readable medium" refer to any medium that participates in providing instructions to a processor for execution. Such a medium may take many forms, including but not limited to, non-volatile media, volatile media, and transmission media. Non-volatile media include, for example, optical or magnetic disks, such as any of the storage devices in any computer(s) operating as discussed above. Volatile media include dynamic memory, such as the main memory of a computer system. Physical transmission media include coaxial cables, copper wire and fiber optics, including the wires that comprise a bus within a computer system. Carrier-wave transmission media can take the form of electric or electromagnetic signals, or acoustic or light waves such as those generated during radio frequency (RF) and infrared (IR) data communications. Common forms of computer-readable media therefore include, for example: a floppy disk, a flexible disk, hard disk, magnetic tape, any other magnetic medium, a CD-ROM, DVD, any other optical medium, less commonly used media such as punch cards, paper tape, any other physical medium with patterns of holes, a RAM, a PROM, and EPROM, a FLASH-EPROM, any other memory chip or cartridge, a carrier wave transporting data or instructions, cables or links transporting such a carrier wave, or any other medium from which a computer can read or send programming codes and/or data. Many of these forms of computer readable media may be involved in carrying one or more sequences of one or more instructions to a processor for execution.

While specific embodiments of the invention have been described above, it will be appreciated that the invention may be practiced other than as described. The description is not intended to limit the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The lithographic apparatus may also be of a type wherein a surface of the substrate is immersed in a liquid having a relatively high refractive index, e.g., water, so as to fill a space between a final element of the projection system and the substrate. Immersion liquids may also be applied to other spaces in the lithographic apparatus, for example between the patterning device and a first element of the projection system. Immersion techniques are well known in the art for increasing the numerical aperture of projection systems.

The terms "radiation" and "beam" used herein encompass all types of electromagnetic radiation, including ultraviolet (UV) radiation (e.g., having a wavelength of or about 365, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to those skilled in the art that modifications may be made to the invention as described without departing from the scope of the claims set out below.

What is claimed is:

1. A method for configuring an illumination source of a lithographic apparatus, the method comprising:

dividing the illumination source into pixel groups, each pixel group including one or more illumination source points;

selecting an initial illumination shape to expose a pattern, the initial illumination shape formed with at least one pixel group;

iteratively calculating a lithographic metric for a plurality of pixel groups, each iteration in said calculating performed for a change of state of one pixel group of said plurality of pixel groups, the change of the state of the one pixel group creating a modified illumination shape, the iteratively calculating comprising adding said one pixel group to the initial illumination shape or removing said one pixel group from the initial illumination shape to create the modified illumination shape, the modified illumination shape including a) the at least one pixel group from the initial illumination shape and said one pixel group in the illumination source or b) the at least one pixel group from said initial illumination shape without said one pixel group in the illumination source, subsequent to said adding or removing, calculating the lithographic metric using the modified illumination shape to determine whether said one pixel group should be added or removed; and adjusting the illumination shape based on the iterative results of calculations.

2. The method of claim 1, wherein states of the plurality of pixel groups are changed with a predetermined order or randomly.

3. The method of claim 2, wherein the state of each of the plurality of pixel groups is changed based on a radial or angular position of each pixel group in the illumination source or both the radial and the angular position of each pixel group in the illumination source.

4. The method of claim 2, wherein the order is based on an increase or decrease of the radial position of the pixel groups.

5. The method of claim 4, wherein the states of the plurality of pixel groups are changed by alternatively changing (a) a state of a pixel group having a radial position greater than that of a predetermined pixel group and (b) a state of a pixel group having a radial position smaller than that of the predetermined pixel group.

6. The method of claim 1, wherein the plurality of pixel groups includes all the pixel groups.

7. The method of claim 1, wherein the lithographic metric is a critical dimension uniformity of the pattern, a process window, a dimension of the process window, MEEF, maximum NILS, or maximum NILS in defocus.

8. The method of claim 7, wherein a value of a critical dimension uniformity as predicted by the lithographic metric is calibrated to match with a measured critical dimension uniformity.

9. The method of claim 1, wherein the lithographic metric is calculated over an assumed budget of errors.

10. The method of claim 9, wherein the errors include a patterning device error, a dose error and a focus error.

11. The method of claim 1, wherein the illumination source is divided into pixel groups in a pupil plane of an illumination system.

12. The method of claim 11, wherein the illumination source includes pixel groups having a normalized radial position σ with respect to a full aperture of the illumination system greater than 1.

13. The method of claim 1, wherein the illumination source is divided into pixel groups based on a symmetry of the pattern.

14. The method of claim 1, wherein calculating the lithographic metric includes calculating an image of the pattern illuminated by the modified illumination shape.

15. The method of claim 14, wherein the lithographic metric is calculated using a photolithographic simulation.

16. The method of claim 15, wherein the photolithographic simulation is performed using a calibrated lump parameter model or a full resist process.

17. The method of claim 1, wherein calculating a lithographic metric includes calculating the lithographic metric for a plurality of pitches.

18. The method of claim 1, wherein the calculating includes determining whether the change of the state of the pixel group in the illumination source should be retained based on results of the metric.

19. The method of claim 18, wherein the calculating includes repeating the changing, the calculating of the lithographic metric and the determining for another pixel group.

20. A method for configuring an illumination source of a lithographic apparatus, the method comprising:

dividing the illumination source into pixel groups, each pixel group including one or more illumination source points;

selecting an initial illumination shape to expose a pattern;

calculating a plurality of responses for a plurality of changes in the illumination source, each of the plurality of changes effected by a change of state of a single pixel group, the calculating comprising adding said single pixel group to the initial illumination shape or removing said single pixel group from the initial illumination shape to create a modified illumination shape, the modified illumination shape including a) the at least one pixel group from the initial illumination shape and said single pixel group or b) the at least one pixel group from said initial illumination shape without said single pixel group, subsequent to said changing, calculating a response using the modified illumination shape to determine whether said single pixel group should be added or removed; and adjusting the illumination shape based on the plurality of responses.

21. The method of claim 20, wherein calculating a plurality of responses includes calculating a lithographic metric.

22. The method of claim 21, wherein calculating the lithographic metric includes calculating an image of the pattern.

23. The method of claim 21, wherein the lithographic metric is a critical dimension uniformity of the pattern, a process window, a dimension of the process window, MEEF, maximum NILS, maximum NILS in defocus.

24. The method of claim 21, wherein the lithographic metric is calculated over an assumed budget of errors.

25. The method of claim 24, wherein the errors include a patterning device error, a dose error and a focus error.

26. The method of claim 20, wherein the plurality of pixel groups are changed with a predetermined order or randomly.

27. The method of claim 20, wherein the change of state of the pixel group is effected based on its influence on heating of a projection lens, the projection lens adapted to project an image of the exposed pattern onto a substrate.

28. A non-transitory computer product having machine executable instructions, the instructions being executable by a machine to perform a method for configuring an illumination source of a lithographic apparatus, the method comprising:

dividing the illumination source into pixel groups, each pixel group including one or more illumination source points;

selecting an initial illumination shape to expose a pattern, the illumination shape formed with at least one pixel group;

iteratively calculating a lithographic metric for a plurality of pixel groups, each iteration in said calculating performed for a change of state of one pixel group of said plurality of pixel groups, the change of the state of the one pixel group creating a modified illumination shape, the iteratively calculating comprising adding said one pixel group to the initial illumination shape or removing said one pixel group from the initial illumination shape to create the modified illumination shape, the modified illumination shape including a) the at least one pixel group from the initial illumination shape and said one pixel group in the illumination source or b) the at least one pixel group from said initial illumination shape without said one pixel group in the illumination source, subsequent to said changing, calculating the lithographic metric using the modified illumination shape to determine whether said one pixel group should be added or removed; and adjusting the illumination shape based on the iterative results of calculations.

29. A lithographic apparatus comprising:

an illumination system configured to condition a beam of radiation;

a substrate table configured to hold a substrate;

a projection system configured to project a beam of radiation patterned by a patterning device onto a surface of the substrate; and a processor configured to perform a method for configuring an illumination source of a lithographic apparatus, the method comprising dividing the illumination source into pixel groups, each pixel group including one or more illumination source points;

selecting an initial illumination shape to expose a pattern, the illumination shape formed with at least one pixel group;

iteratively calculating a lithographic metric for a plurality of pixel groups, each iteration in said calculating performed for a change of state of one pixel group of said plurality of pixel groups, the change of the state of the one pixel group creating a modified illumination shape, the iteratively calculating comprising adding said one pixel group to the initial illumination shape or removing said one pixel group from the initial illumination shape to create the modified illumination shape, the modified illumination shape including a) the at least one pixel group from the initial illumination shape and said one pixel group or b) the at least one pixel group from said initial illumination shape without said one pixel group, subsequent to said changing, calculating the lithographic metric using the modified illumination shape to determine whether said one pixel group should be added or removed; and adjusting the illumination shape based on the iterative results of calculations.

* * * * *